United States Patent
Bezama et al.

(10) Patent No.: US 8,115,303 B2
(45) Date of Patent: Feb. 14, 2012

(54) SEMICONDUCTOR PACKAGE STRUCTURES HAVING LIQUID COOLERS INTEGRATED WITH FIRST LEVEL CHIP PACKAGE MODULES

(75) Inventors: Raschid Jose Bezama, Mahopac, NY (US); Evan George Colgan, Chestnut Ridge, NY (US); Michael Gaynes, Vestal, NY (US); John Harold Magerlein, Yorktown Heights, NY (US); Kenneth C. Marston, Poughquag, NY (US); Xiaojin Wei, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 12/120,029

(22) Filed: May 13, 2008

(65) Prior Publication Data

US 2009/0283902 A1 Nov. 19, 2009

(51) Int. Cl.
*H01L 23/40* (2006.01)

(52) U.S. Cl. . 257/719; 257/707; 257/713; 257/E23.083; 257/E23.103

(58) Field of Classification Search .................. 257/719, 257/718
See application file for complete search history.

(56) References Cited

U.S. PATENT DOCUMENTS

| | | | | |
|---|---|---|---|---|
| 5,548,482 A | * | 8/1996 | Hatauchi et al. | 361/720 |
| 5,949,137 A | * | 9/1999 | Domadia et al. | 257/712 |
| 5,966,290 A | * | 10/1999 | Sammakia et al. | 361/705 |
| 5,977,622 A | * | 11/1999 | Mertol | 257/687 |
| 6,229,702 B1 | * | 5/2001 | Tao et al. | 361/704 |
| 7,211,889 B2 | * | 5/2007 | Shim | 257/711 |
| 2001/0009196 A1 | * | 7/2001 | Carden et al. | 174/52.4 |
| 2003/0030140 A1 | * | 2/2003 | Shim | 257/712 |
| 2003/0176020 A1 | * | 9/2003 | Tsao et al. | 438/122 |
| 2005/0199998 A1 | * | 9/2005 | Chen et al. | 257/706 |
| 2008/0116570 A1 | * | 5/2008 | Awad et al. | 257/718 |
| 2008/0305585 A1 | * | 12/2008 | Chainer | 438/122 |

* cited by examiner

*Primary Examiner* — Wael Fahmy
*Assistant Examiner* — Abul Kalam
(74) *Attorney, Agent, or Firm* — F. Chau & Associates, LLC; Louis J. Percello, Esq.

(57) ABSTRACT

Semiconductor package structures are provided which are designed to have liquid coolers integrally packaged with first level chip modules. In particular, apparatus for integrally packaging a liquid cooler device within a first level chip package structure include structures in which a liquid cooler device is thermally coupled directly to the back side of an integrated circuit chip flip-chip mounted on flexible chip carrier substrate. The liquid cooler device is mechanically coupled to the package substrate through a metallic stiffener structure that is bonded to the flexible package substrate to provide mechanical rigidity to the flexible package substrate.

11 Claims, 19 Drawing Sheets

SEMICONDUCTOR PACKAGE STRUCTURES HAVING LIQUID COOLERS INTEGRATED WITH FIRST LEVEL CHIP PACKAGE MODULES

BACKGROUND

1. Technical Field

The present invention relates generally to semiconductor package structures having liquid coolers integrally packaged with first level chip modules and, more specifically, apparatus and methods for integrally packaging a liquid cooler device with in a first level chip package structure wherein the liquid cooler device is thermally coupled directly to the back side of an integrated circuit chip flip-chip mounted on flexible chip carrier substrate, and wherein the liquid cooler device is mechanically coupled to the package substrate through a metallic stiffener structure that is bonded to the flexible package substrate to provide mechanical rigidity to the flexible package substrate.

2. Discussion of Related Art

Technological innovations in semiconductor fabrication and packaging technologies have enabled development of high performance, and high integration density semiconductor chip modules. As chip geometries are scaled down and operating speeds are increased and chip packages become more compact, however, power densities are increased resulting in more heat generation per unit area. The increased power density poses practical limitations to the level of integration density and performance that may be achieved. Indeed, the ability to implement chip modules with higher densities and higher performance is limited primarily by the ability to effectively cool the chip modules during normal operation. For instance, as heat is generated by IC chips during normal operation, cooling structures must be employed to provide sufficiently low thermal resistance paths between the chips and ambient air or a circulating liquid coolant to adequately remove heat and maintain the operating temperature of the chips low enough to assure continued reliable operation. In high performance, high density chip package structures, air cooling solutions are not capable of removing heat due to very high power density or due to space and/or air flow limitations, thereby requiring liquid cooling solutions (e.g., water coolant).

Moreover, effective cooling solutions are important in high performance, high density package structures to minimize mechanical stresses that may occur over temperature cycling (caused by power cycling) due to the differences in thermal expansion between different components of the chip package structure. More specifically, package components formed from materials having different coefficients of thermal expansion (CTE) tend to expand and contract by different amounts during thermal cycling, which is a phenomenon known as "CTE mismatch". The CTE represents the ratio of change in dimensions to original dimensions per degree rise in temperature, expressed in ppm/° C. CTE mismatch denotes the difference in the coefficients of thermal expansions of two materials or components joined together, which produces strains and stresses at joining interfaces or in attachment surfaces.

By way of example, in conventional packaging technologies, chip level packages can be constructed with one or more chips mounted on a thin flexible first level package substrate, such as an organic laminate build up package substrate, using micro solder bump connections, referred to as C4's (controlled collapse chip connection). A key issue with first level organic package substrates is the CTE mismatch between silicon chips (~3 ppm/C) and the composite laminate carrier substrate (15-20 ppm/C) to which the chips are attached via C4s. Such CTE mismatch can result in mechanical stresses on the C4 connections between the chip and the organic carrier substrate during thermal cycling. As these mechanical stresses are applied over repeated thermal cycles, the C4 connections may become fatigued and fail. To counteract stress to C4 connections, underfill materials may be applied between the chip and carrier to protect the C4 solder bumps.

Moreover, even when underfill material is used to maintain the structural integrity of C4 contacts, the stress generated by the CTE mismatch between the silicon chip and organic substrate, for example, can result in bowing or bending of substrates and chips. For instance, the differences in thermal expansion between the silicon chip and the organic carrier substrate can cause the chip to warp by 60 microns or more after processing, and cause the substrate to be even more substantially warped. Such bending/bowing can not only generate significant stresses and strains in the electrical contacts between the chip and substrate, but the chip may be subjected to a high tensile stress, so a small defect or scratch can result in chip cracking or delamination of the organic substrate layers. This warpage resulting from CTE mismatch between silicon chip and organic carrier substrate during thermal cycling becomes worse as the chip size increases and this is particularly problematic for lidless packages where the backside surface of the chip is exposed.

To counteract possible warping of package, various types of mechanical stiffening structures may be employed to provide mechanical rigidity to flexible package substrates such as polymer substrates and organic laminate build up package substrates. For instance, conventional packaging techniques utilize mechanical stiffener structures, e.g., planar stiffener plates, package lid structures, and a combination of stiffener plates and package lid structures, which are bonded to package substrates in ways that counteract mechanical stresses arising from differential thermal expansion between chip and substrate, for example, to reduce flexure during thermal cycling and otherwise improve the overall structural reliability of the package. Various conventional semiconductor chip package structures in which mechanical stiffening structures are used with first level SCM (single chip module) chip packages to reduce flexure, will be now be discussed in detail below with reference to FIGS. 1A/B, 2A/B and 3.

FIGS. 1A and 1B schematically illustrate an embodiment of an electronic module (10) having a conventional framework for packaging a single chip module (SCM) with a liquid cooling module onto a circuit board (20). In particular, FIG. 1A is a schematic side view of an electronic module (10) comprising a circuit board (20) (PCB, node card, printed wiring board, printed circuit card, etc.), a $1^{st}$ level chip package (30) and cooler device (40) in a stacked configuration. The chip package (30) generally comprises an organic laminate package substrate (31) (or "chip carrier"), an IC (integrated circuit) chip (32), and a package lid (33). The cooler (40) is mechanically attached to the circuit board (20) using an attachment device (50). FIG. 1B is a schematic top plan view of the electronic module (10) along line 1B-1B in FIG. 1A, excluding the package lid (33), cooler device (40) and attachment devices (50).

As depicted in FIGS. 1A and 1B, the semiconductor IC chip (32) is flip-chip mounted to a top-side surface of the chip carrier substrate (31) using an array of fine pitch solder balls (34) such as C4 (Controlled Collapsed Chip Connect) solder balls that provide electrical connections between an array of I/O pads on the active surface of the chip (32) and a footprint of corresponding I/O pads on the top-side surface of the chip carrier substrate (31). The IC chip (32) is mechanically coupled to the organic chip carrier substrate (31) using an underfill material (35) disposed between the IC chip (32) and the organic chip carrier (31) encapsulating the C4 connections (34). The chip (32) is disposed in a central region of the substrate (31) and surrounded by underfill material (35) which extends beyond the edge of the chip (32) to form a fillet. The underfill material (35) (e.g., epoxy) is a rigid material that serves to redistribute mechanical stresses in the interface between the chip (32) and the carrier substrate (31) caused by the CTE mismatch between the chip carrier (31) and the chip (32), to thereby minimize stress applied to the C4 connections (34). Other devices such as decoupling capacitors (37) are shown mounted on the first surface of the chip carrier (31) using micro solder balls. In FIG. 1B, the decoupling capacitors (37) are shown to be placed along two opposite sides of the chip (32).

The chip carrier substrate (31) may comprise electrical contacts formed on the first surface thereof to provide electrical interconnections between the chip (32) and devices (37) using wiring inside the substrate (31) (not shown). As depicted in FIG. 1A, an array of larger pitch solder balls (36) provide electrical connections between an array of contact pads formed on a second major (bottom) surface of the substrate (31) and a corresponding array of I/O contacts formed on the top surface of the circuit board (20), providing an area array connection known as a ball grid array (BGA). The circuit board (20) includes a plurality of wiring layers (21) that are connected to one or more plated through holes (22). The plated through holes (22) provide electrical connections between the array of I/O contacts on the top surface of the board (20) with the wiring layers (21) connected to the plated through holes (22).

In the exemplary framework of FIGS. 1A-B, the package lid (33) functions as a mechanical stiffener member and a heat spreader. The package lid (33) includes an outer rim (33a) that surrounds and defines a lid cavity (33b) region that encloses the integrated circuit chip (32) and other devices (37) when the package lid (33) is mounted to the chip carrier (31). The package lid (33) is attached to the chip carrier (31) by bonding the lid outer rim (33a) to the outer peripheral surface region of the chip carrier (31) using a layer of adhesive material (38). In this regard, the package lid (33) serves as a stiffener member that provides supports for the chip carrier substrate (31) to counteract thermal/mechanical stresses and reduce semiconductor package warpage and improve the overall reliability. The package lid (33) can be made of copper with a thickness of 0.5 mm to 2.0 mm. The package lid (33) design can vary depending on the application but the package lid (33) design is an important consideration in the overall package framework as a package lid which is too thick and too stiff can result in excessive stress and failure in the package.

The package lid (33) also serves as a heat spreader for cooling the IC chip (32) wherein the package lid (33) extends over the back surface of the chip (32) wherein the inner surface of the lid cavity (33b) is thermally coupled to the backside of the chip (32) using a layer of thermal interface material (TIM) (39). The TIM layer (39) is typically formed of a mechanically compliant, thermally conductive material which provides mechanical compliance and serves as a primary thermal path to transfer heat from the IC chip (32) to the package lid (33). The package lid (33) is thermally coupled to the cooling device (40) using a second layer of TIM (45). The TIM layer (39), package lid (33) and second TIM layer (45) provide a thermal path for conducting heat from the backside of the chip (32) to the cooling device (40) where the heat is dissipated by the cooling device (40) via air or liquid cooling. In the conventional framework of FIG. 1A, the second TIM layer (45) would typically consist of a filled paste or grease, or a phase change material such as a filled wax, which are reworkable, as opposed to a filled adhesive or gel material which require curing at 100-150 C and are not easily reworkable. For most TIMs, the filler material has a high thermal conductivity such as silver, graphite, or ceramic particles, for example. The first TIM layer (39) between the chip (32) and the bottom surface of the package lid (33) would typically be a filled adhesive or gel material as opposed to a fluid material such as pastes or greases that could be "pumped out" by the package displacements during thermal cycling. This would be less of a concern for the second TIM layer (45) when, for instance, the cooler (40) and package lid (33) are formed of the same material, e.g., copper, or materials having similar CTEs.

The cooling device (40) may be an air cooled heat sink or a liquid cooler device having a plurality of thermal fins (41) that define open channels (42) through which air or liquid may flow to remove heat from the thermal fins (41). The cooler (40) is mechanically attached to the mother board (20) using the attachment device (50) which is configured to apply a compressive load to hold the cooler (40) against the top surface of the package lid (33). As depicted in FIG. 1B, a plurality of mounting holes (51) are formed through the mother board (20) in proximity to each corner of the carrier substrate (31) for insertably receiving the attachment devices (50). This attachment scheme uses hardware that requires holes (51) to be formed in the electrical board (20) which blocks some wiring channels of the circuit board (20). In this conventional framework, the SCM chip package (30) would be attached to the circuit board (20) by a solder reflow process if BGA or CGA electrical interconnects are used, or plugged into a socket if PGA electrical interconnects are used, or aligned to an LGA connector if LGA electrical interconnects are used. The second TIM layer (45) would then be dispensed onto the lid (33), or the bottom of the cooler device (40), and they would be joined and the cooler device (40) secured to the circuit board (20) by the attachment devices (50). As described above, it would be desirable to use a TIM2 (45) material which is reworkable and does not require curing at an elevated temperature.

FIGS. 2A and 2B schematically illustrate another embodiment of an electronic module having a conventional framework for packaging a single chip module (SCM) with a cooling module onto a circuit board (20). In particular, FIG. 2A is a schematic side view of an electronic module (11) including a printed circuit board (PCB) (20) (or node card, printed wiring board, or printed circuit card), a 1$^{st}$ level chip package (60) and cooler device (40) in a stacked configuration with the chip package (60) interposed between the circuit board (20) and the cooler device (40). FIG. 2B is a schematic top plan view of the electronic module (11) along line 2B-2B in FIG. 2A excluding the planar package lid (64), cooler device (40) and attachment devices (50). Except for the first level chip package (60), the electronic module (11) illustrated in FIGS. 2A-B has a conventional framework that is similar to that of the electronic module (10) in FIGS. 1A-1B, and therefore, a detailed explanation is not required.

The chip level package (60) includes a separate stiffener member (62) and a planar package lid (64). As shown in FIG. 2A, the stiffener member (62) is attached to a perimeter region of the organic laminate chip carrier (31) with a layer of adhesive material (61) and the planar package lid (64) is attached to the stiffener member (62) with a layer of adhesive material (63). As depicted in FIG. 2B, the stiffener member (62) has a rectangular frame-like structure with an outer border (62a) and inner border (62b). The outer border (62a) has a rectangular shape that corresponds to the outer perimeter of the chip carrier substrate and the inner border (62b) has a rectangular shape that defines an inner open region which aligns to the inner surface region of the carrier substrate (31) in the area occupied by the chips (32) and surrounding devices (37).

As compared to the conventional package structure (10) of FIGS. 1A/1B, the conventional package structure (11) of FIGS. 2A and 2B can be constructed in a process by which the stiffener member (62) is attached to the organic carrier (31) prior to the chip mounting process, which reduces possible warping of the substrate (31) and maintains the flatness of the substrate (31) before the chip (32) is attached to the chip carrier substrate (31), and further provides the requisite mechanical support during a solder reflow process when the chip (32) is mounted to the chip carrier (31). The types of adhesive used to form layers (61) and (63) will vary depending on the desired mechanical properties.

In this conventional framework, the SCM chip package (60) would be attached to the circuit board (20) by a solder reflow process if BGA or CGA electrical interconnects are used, or plugged into a socket if PGA electrical interconnects are used, or aligned to an LGA connector if LGA electrical interconnects are used. A second TIM layer (45) would then be dispensed onto the lid (33), or the bottom of the cooler device (40), and they would be joined and the cooler device (40) secured to the circuit board (20) by the attachment devices (50). As described above, it would be desirable to use a TIM2 (45) material which is reworkable and does not require curing at an elevated temperature.

FIG. 3 schematically illustrates another embodiment of an electronic module having a conventional framework for packaging a single chip module (SCM) with a cooling module onto a circuit board (20). In particular, FIG. 3 is a schematic side view of an electronic module (12) including a printed circuit board (PCB) (20) (or node card, printed wiring board, or printed circuit card), a $1^{st}$ level chip package (70) and cooler device (40) in a stacked configuration with the chip package (70) interposed between the circuit board (20) and the cooler device (40). The cooler (40) is mechanically attached to the circuit board (20) using an attachment device (50). Except for the first level chip package (70), the electronic module (12) illustrated in FIG. 3 has a conventional framework with similar components of the electronic modules (10) and (11) discussed above, and therefore, a detailed explanation is not required.

With the electronic module (12) of FIG. 3, the chip level package (70) includes a rectangular shaped stiffener member (72) that is attached to a perimeter region of the organic laminate chip carrier (31) with a layer of adhesive material (71), but the chip level package (70) does not include a package lid structure (as compared to the chip package (30) with package lid (33) and the chip package (60) with package lid (64)). The electronic module (12) is a lidless SCM structure in which the stiffener member (72) may have a structure similar to the stiffener member (62) depicted in FIG. 2B, but the thickness of the stiffener member (72) can be varied to obtain a given stiffness. In the conventional embodiment of FIG. 3, a heat spreading function is achieved by thermally bonding the backside of the chip (32) directly to the bottom surface of the cooler device (40) using a mechanically compliant, thermal interface layer (TIM) (73).

The conventional package structure (12) of FIG. 3 provides a lower thermal resistance thermal path between the backside of the chip (32) and cooler (40), as compared to the conventional lidded SCM package structures (10) and (11) in which lid structures are disposed in the thermal path between the chip (32) and cooling device (40). Indeed, a lower thermal resistance path is achieved by eliminating the thermal resistance of a package lid between the chip (32) and cooler (40) and the thermal resistance that exists due to the TIM2 layer (45) between the package lid and cooler (40). Indeed, in FIG. 3, the thermal resistance in the path between the chip (32) and cooler (40) is based on the thickness and material used to form the TIM layer (73). Although a lidless chip package structure (12) of FIG. 3 can theoretically provide increased thermal performance, the ability to actually achieve a low thermal resistance TIM layer (73) between the chip (32) and cooler (40) in the framework of FIG. 3 is problematic by virtue of the increased mechanical complexity of having the cooler (40) attached to the circuit board (20) and the chip (32) attached to the laminate carrier (31) which is attached to the board (20).

More specifically, in the framework of FIG. 3, the cooler (40) is mechanically attached to the circuit board (20) using the attachment device (50), which would typically apply a compressive load to hold the cooler (40) in a fixed position against the backside surface of the chip (32) With this framework, it is important to obtain and maintain the requisite bond line (i.e., desired uniform thickness of TIM (73) between the chip (32) and cooler (40). Thus, when the cooler (40) is being mounted, it is important to ensure that the cooler (40) is maintained flat against the back surface of the chip (32), and that excessive force is not applied to the chip (32), and that the chip (32) is protected against excessive forces from shock or vibration so as to obtain and maintain the requisite bond line of TIM layer (73). The TIM layer (73) would typically consist of a filled paste or grease, as it is undesirable to use a filled adhesive or gel materials which would require curing at 100-150° C. and which are not easily reworkable. However, the disadvantage of using a paste or grease is its tendency to pump out from the space between the backside of the chip (32) and the cooler (40) as a result of thermal excursions where chip warpages vary due to the mechanical complexity of having the cooler (40) attached to the board (20) and the chip (32) attached to the laminate carrier (31) which is attached to the board (20).

In this conventional framework, the SCM chip package (70) would be attached to the circuit board (20) by a solder reflow process if BGA or CGA electrical interconnects are used, or plugged into a socket if PGA electrical interconnects are used, or aligned to an LGA connector if LGA electrical interconnects are used. A TIM layer (73) would then be dispensed onto the back side of the chip (32), or the bottom of the cooler device (40), and they would be joined and the cooler device (40) secured to the circuit board (20) by the attachment devices (50). As described above, it would be desirable to use a TIM (73) material which is reworkable and does not require curing at an elevated temperature.

State of the art chip packaging technologies typically utilize metallic material such as copper to construct chip package cooler devices (e.g., liquid coolers) or heat sink structures because copper has a very high thermal conductivity, and can be readily machined/etched/formed into fine features and dimensions (e.g., micro channel cooler devices) with low manufacturing costs. Typically, copper liquid cooler devices are used for cooling chips mounted on ceramic multichip modules (MCMs). However, in each of the conventional frameworks discussed above, the cooler (40) is physically attached to the circuit board (20), the footprint of the cooler (40) must be larger than the footprint of the chip (32) and extend past the outer periphery of the chip (32) so as to connect to the board (20). This large size metallic cooler posed practical limitations such as follows:

When a BGA (ball grid array) or CGA (column grid array) attachment techniques are used to mechanically/electrically connect the carrier (31) to the circuit board (20), a large size metallic cooler (40) results in a large thermal mass that is not compatible with the BGA or CGA reflow process. Moreover, the resulting weight of the SCM module may be too high preventing the module from self-aligning to the printed circuit board pads and can compress the liquid solder excessively thereby causing shorts during the solder reflow process. Therefore, with a BGA or CGA electrical interconnect to the circuit board (20) a large size metallic cooler may need to be attached to the SCM chip package after the reflow process used to attach the SCM chip package to the circuit board. For other mechanical area array connection methods such as LGA (land grid array) or a pin grid array (PGA), where a compressive force must be applied for actuation, such compressive forces may result in a thin and/or non uniform thickness of the TIM layer between the liquid cooler and chip.

In this regard, when designing chip packages, various factors must be considered, such as carrier structure, types of package materials and underfill used, the fabrication process flow, chip size, thermal properties, etc., to minimize or prevent package defect mechanisms and structural failures as a result of strains and stresses that may arise from thermal cycling during production, joining processing, and use.

BRIEF SUMMARY

Exemplary embodiments of the invention generally include semiconductor package structures having liquid coolers integrally packaged with first level chip modules and, more specifically, apparatus and methods for integrally packaging a liquid cooler device within a first level chip package structure wherein the liquid cooler device is thermally coupled directly to the back side of an integrated circuit chip flip-chip mounted on flexible chip carrier substrate, and wherein the liquid cooler device is mechanically coupled to the package substrate through a metallic stiffener structure that is bonded to the flexible package substrate to provide mechanical rigidity to the flexible package substrate. Exemplary embodiments of the invention include a variety of structures for integrating a metallic liquid cooling device with a metallic stiffener and/or lid for a high power IC chip mounted active side down on an organic carrier to form first level package structures that can be subsequently attached to a printed wiring board using an array of solder balls, an array of solder columns, a land grid array, or a pin grid array.

For example, in one exemplary embodiment of the invention, a metallic cooler device is integrated into a first level chip package module using a metallic stiffener member having a planar frame portion that is adhesively bonded to an outer peripheral region of the first surface of the carrier substrate, and extension tabs that extend from the planar frame portion towards the metallic cooler, wherein the extension tabs are coupled to the metallic cooler device to provide a mechanical attachment for the metallic cooler device. The stiffener extensions provide a mechanical attachment for the cooler and/or a controlled compressive force between the cooler and the chip mounted on the carrier.

In other exemplary embodiments of the invention, metallic coolers are designed with extensions that overlap and are adhesively attached to a stiffener or extensions which are adhesively attached directly to the top surface of the organic carrier. In other exemplary embodiments, the edges of the cooler are joined to an opening which is formed in the package lid where the lid is either attached to a stiffener which is attached to the carrier, or the lid is attached directly to the carrier. In a preferred embodiment, the active region of the cooler is smaller than the area of the chip, but including the seal regions and manifold regions, the cooler is equal in size, or extends beyond the chip.

These and other exemplary embodiments, aspects, features, and advantages of the present invention will become apparent from the following detailed description of exemplary embodiments, which is to be read in connection with the accompanying drawings.

DETAILED DESCRIPTION

Various techniques for constructing electronic modules having chip level package structures with integrally packaged metallic liquid cooling devices will now be described in further detail with reference to exemplary embodiments discussed hereafter. In general, electronic apparatus according to exemplary embodiments of the invention include semiconductor chip modules, such as SCMs, having an IC chip flip chip mounted on a first (top side) surface of a flexible carrier substrate having an area array of electrical contacts formed on a second (bottom side) surface of the substrate opposite the first surface, a metallic cooler thermally coupled directly to a backside surface of the IC chip and a stiffener member which is (i) bonded to the first surface of the carrier substrate to provide mechanical rigidity to the carrier substrate, as well as (ii) mechanically coupled to the metallic cooler to fixedly dispose the metallic cooler device in place on the backside of the IC chip.

The maturity of organic laminate substrate technology has rapidly increased while the unit cost has decreased, and it is now the preferred $1^{st}$ level packaging technology for high performance chip carriers. A typical organic carrier substrate consists of multiple core layers, typically with sequentially built up fine-pitch wiring layers on top and bottom surfaces, with a total thickness of about 0.8 mm or less. In the future, to support finer via pitches and line widths, the total thickness will be reduced to 0.5 mm and perhaps even to 0.3 mm. This reduction in thickness will greatly reduce the stiffness and mechanical strength of the organic carrier substrate, resulting in them being even more flexible. Exemplary embodiments of the invention as discussed herein below allow for integration of metallic liquid cooler devices in first level chip packages where chips are mounted face down on thin organic substrates.

Figure 4A:
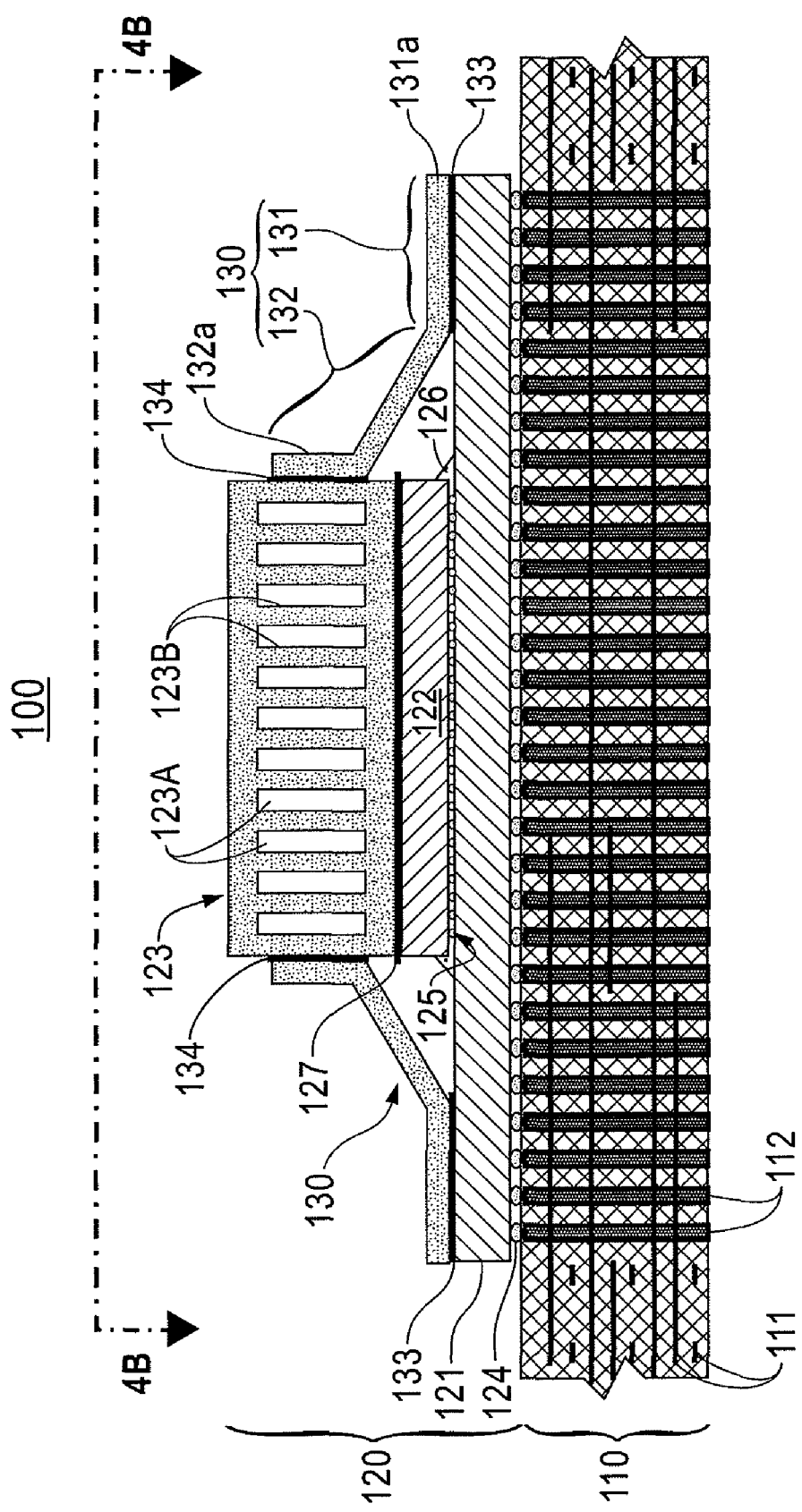
FIGS. 4A and 4B schematically illustrate an electronic module having a chip level package structure with an integrated cooler, according to an exemplary embodiment of the invention.
Figure 4B:
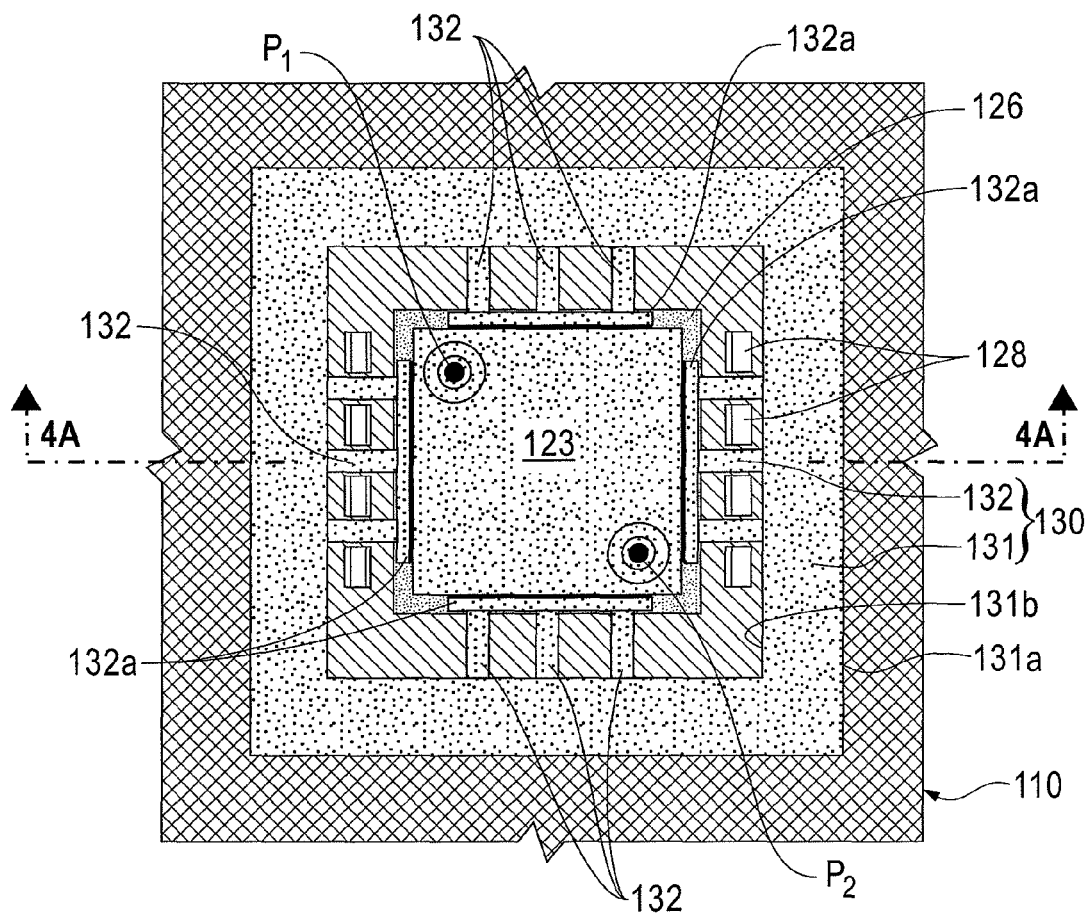

FIGS. 4A and 4B schematically illustrate an electronic module having a chip level package structure with an integrated cooler, according to an exemplary embodiment of the invention. In particular, FIGS. 4A and 4B are schematic views of an electronic module (100) comprising a circuit board (110) (e.g., PCB, node card, printed wiring board, printed circuit card, etc,) and a chip package structure (120) mounted on the circuit board (110). FIG. 4A is a schematic side view of the electronic module (100) taken along line 4A-4A in FIG. 4B, and FIG. 4B is a top plan view of the electronic module (100) along line 4B-4B in FIG. 4A. As shown in FIG. 4A, the chip package structure (120) may be a first level chip package structure comprising a first level chip carrier (121) (package substrate), an IC (integrated circuit) chip (122), a cooler device (123) stacked on the backside of the IC chip (122) and a metallic stiffener member (130). In general, the package substrate (121) is a flexible substrate, such as a polymer substrate or organic build-up laminate substrate, etc., which is electrically and mechanically coupled to the the circuit board (110) using an area array of electrical contacts (124) such as BGA electrical contacts, although other area array connection techniques may be used to mechanically and electrically couple the chip package structure (120) to the circuit board (110), such as CGA, PGA or LGA connections. The circuit board (110) comprises various levels of wiring (111) and a plurality of plated through holes (112) that are electrically connected to the contacts (124).

The IC chip (122) is flip-chip mounted to the top surface of the chip carrier (121) using an area array of C4 solder ball connections (125) and an underfill material (126) (e.g., epoxy) that encapsulates the C4 contacts (125) and bonds the chip (122) to the carrier (121). The metallic liquid cooling module (123) (or cooling apparatus) is thermally coupled directly to the non-active surface of the IC chip (122) using a TIM1 layer (127) and fixedly disposed on the non-active surface of the IC chip (122) using a stiffener member (130). As explained hereafter, the stiffener member (130) serves a dual function of providing mechanical rigidity to the flexible substrate (121) and mechanically coupling the cooler device (123) to fixedly hold or otherwise clamp the cooler device (123) in place on the backside of the chip (122) for purposes of integrating the cooler (123) into the $1^{st}$ level chip package.

As illustrated in FIGS. 4A and 4B, the stiffener member (130) comprises a planar frame portion (131) and a plurality of extended portions (132) (alternatively referred to as "extension tabs"). The planar frame portion (131) is an outer frame structure that is bonded to the peripheral surface region of the substrate (121) via a layer of adhesive (133) (e.g., a flexible adhesive material such as 3M 1509 or a much stiffer adhesive such as Pyralux). The extension tabs (132) extend from the frame portion (131) and have bent end portions (132a) that are bonded to the sidewalls of the cooler (123) with a layer of adhesive (134) or joining material such as a solder. As readily illustrated in FIG. 4B, the frame portion (131) of the metallic stiffener member (130) comprises a continuous, planar rectangular-shaped frame structure with an outer border (131a) and an inner border (131b), which is sized and shaped to bond to the peripheral surface region of the chip carrier (121). The outer border (131a) has a rectangular shape that corresponds to the outer perimeter of the chip carrier substrate (121) and the inner border (131b) has a rectangular shape that defines an inner open region which aligns to the inner surface region of the carrier substrate (121) in the area occupied by the chip (122) and surrounding devices (128). The extension tabs (132) are arranged on each side of the cooler device (123) and extend from each side of the inner rectangular border (131b) of the planar frame (131) with the extension tabs (132) bonded to the sidewalls of the cooler (123). The cooler device (123) includes coolant fluid inlet and outlet ports P1, P2 on the top surface of the cooler (123).

In the exemplary embodiment of FIG. 4B, the stiffener extension tabs (132) are not continuous but have openings aligned to and exposing regions of the substrate (121) on which decoupling capacitors (128) are mounted. In particular, in FIG. 4B, the extension tabs (130) on each side of the cooler (123) include three separate tabs that are commonly connected at the ends thereof, i.e., one end of the tabs are commonly connected to the planar frame portion (131) and other ends of the tabs are connected to a single bent end portion (132a) which is coupled to the sidewall of the cooler device (123). In another embodiment, each extension tab (132) that extends from the inner border (131b) on each side of the cooler (123) may be one continuous tab structure that extends over the top of any decoupling capacitors (128) or other components, with no openings.

It is to be appreciated that extension tabs (132) can be fabricated as part of the stiffener (130) and integrally formed with the frame portion (131). The stiffener member (130) with extension tabs (132) can be formed from stamping a thin planar metallic material such as copper or aluminum to form a planar metallic pattern of the frame and tabs, followed by a secondary operation to physically bend portions of the resulting stiffener into a desired shape, or the modified stiffener could perhaps be fabricated in a single stamping or coining operation. It is to be appreciated that stiffener structures with extension tabs can be designed with varying shapes and dimensions to provide varying degrees of mechanical coupling and stiffness between the portion of the stiffener attached to the perimeter of the carrier and the cooler mounted over the chip to flatten the carrier, reduce the stress in the chip due to the thermal expansion mismatch between the carrier and chip, and improve the reliability by reducing the total flexure during thermal cycling. For example, the stiffener extension tabs can be formed with ridges, bends, and/or creases to achieve certain mechanical properties that provide necessary mechanical forces for fixedly maintaining the cooler device in position on the backside surface of the chip.

Figure 5:
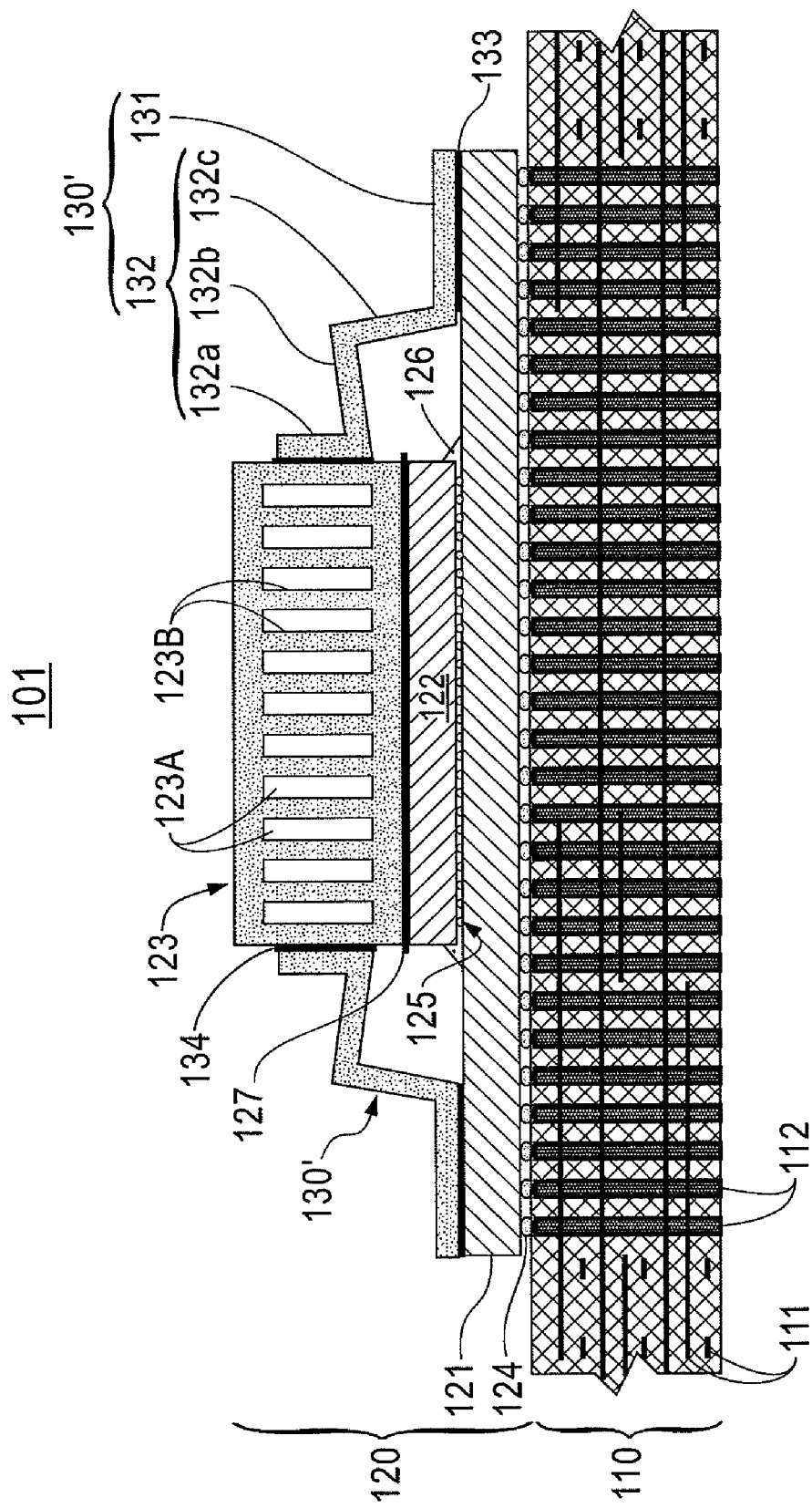
FIG. 5 schematically illustrates an electronic module having a chip level package structure with an integrated cooler, according to another exemplary embodiment of the invention.
Figure 6:
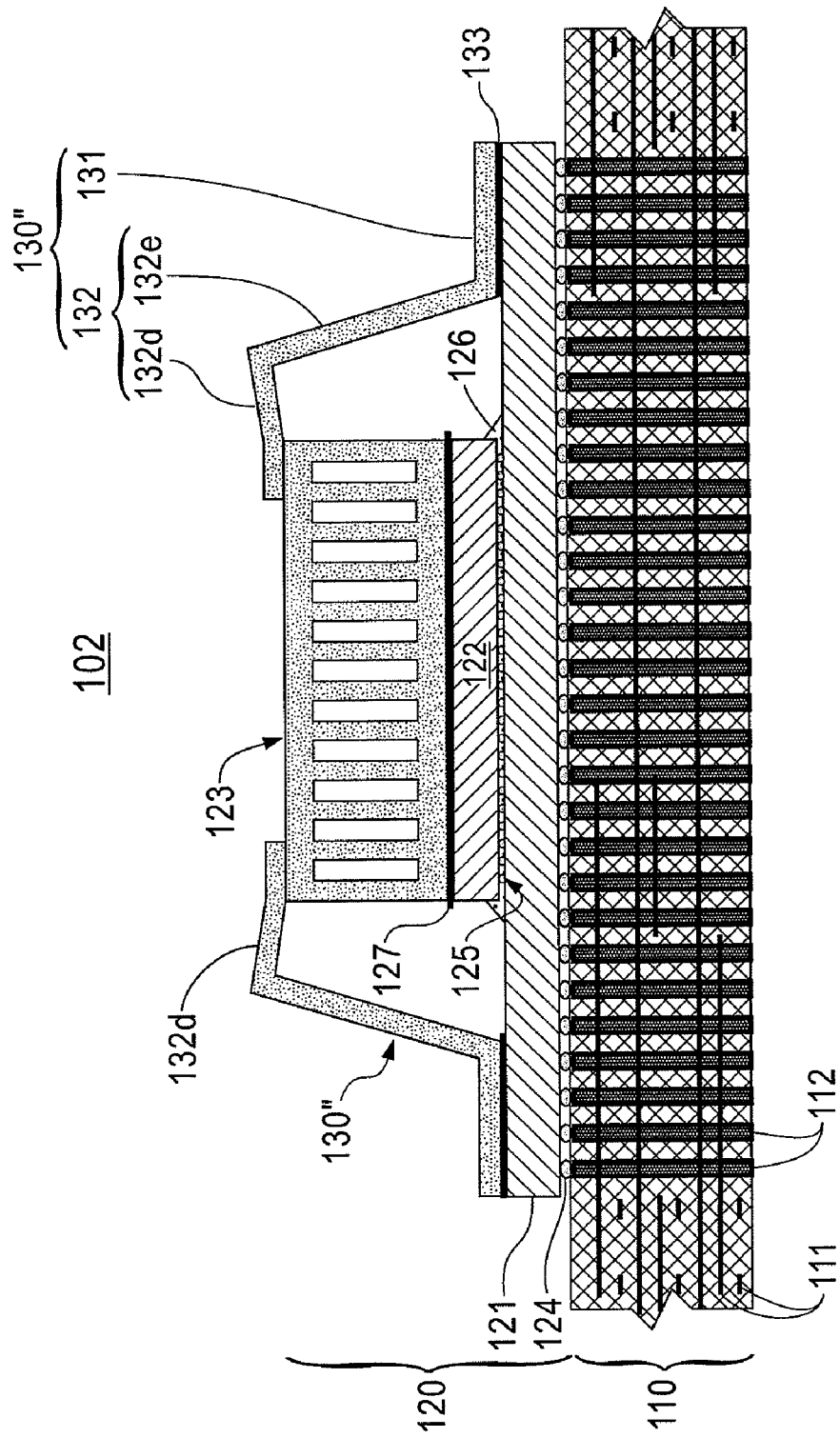
FIG. 6 schematically illustrates an electronic module having a chip level package structure with an integrated cooler, according to another exemplary embodiment of the invention.

In FIG. 4A, the stiffener member (130) has extension tabs (132) that are designed to fixedly clamp the cooler (123) in position over the backside of the chip (122). In other exemplary embodiments of the invention, the extension tabs (132) can be shaped to not only fixedly clamp the cooler (123) in position over the backside of the chip (122), but also shaped to be in tension to apply a downward force to hold the cooler (123) against the back surface of the chip (121). For example, FIGS. 5 and 6 schematically illustrate electronic modules having chip level packages with integrated cooler modules according to other exemplary embodiments of the invention. In particular, FIGS. 5 and 6 are schematic side views of respective electronic modules (101) and (102) that are similar in design to the electronic module (100) of FIG. 4A except for differences in shapes and configurations of stiffener members.

In FIG. 5, a stiffener member (130') includes a planar frame portion (131) and extension tabs (132) that are shaped to not only fixedly clamp the cooler (123) in position over the backside of the chip (122), but also shaped to be in tension to apply a downward force to hold the cooler (123) against the back surface of the chip (122) in FIG. 5, the extension tab (132) includes a plurality of bent portions (132a), (132b) and (132c), with the end portion (132a) fixedly bonded to the sidewalls of the cooler (123). In this framework, the bent portions (132b) and (132c) are bent/shaped relative to each other or otherwise shaped to be in tension when assembled such that the tension applies a downward force on the cooler (123).

Furthermore, FIG. 6 illustrates a stiffener member (130") having a planar frame portion (131) and extension tabs (132) having portions (132d) and (132e), where the end portions (132d) extends over the edge of the upper surface of the cooler (123). The portions (132d) and (132e) are bent relative to each other or otherwise shaped to be in tension when assembled such that end portion (132d) applies a downward force on top surface of the cooler (123).

In the exemplary embodiments of FIGS. 4A, 5 and 6, the TIM layer (127) between the cooler (123) and the chip (122) may be a compliant filled adhesive or gel, or a soft solder layer such as Indium, though other types of TIMs could also be used. Preferably, a compliant thermal adhesive material or a soft solder material is used to form the TIM1 layer (127) when there is a CTE mismatch between the materials of the chip (122) (e.g., silicon) and the metallic cooler (123) (e.g., copper) so as to maintain the integrity of the thermal bond and counteract mechanical stresses that may arise due to differential thermal expansion of the chip and cooler surfaces. If the TIM1 layer (127) is formed of a low strength material, or a if a gel-type TIM is used, the stiffener extension tabs (132) can be sized and shaped to not only fixedly hold the cooler (123) in position over the backside of the chip (122), but to also apply a downward, compressive force to the cooler (123) when assembled to the cooler (123), which clamps the cooler (123) down against the backside surface of the chip (122). This clamping force can prevent any large tensile force being applied across the TIM1 layer (127) due to shock or vibration, which could tear or separate the TIM layer (127) from the surfaces to which it is bonded. This could be accomplished, for example, by applying an appropriate weight to the top surface of the cooler (123) when it is being attached to the stiffener extensions (132) and the adhesive materials are being cured.

Figure 1A:
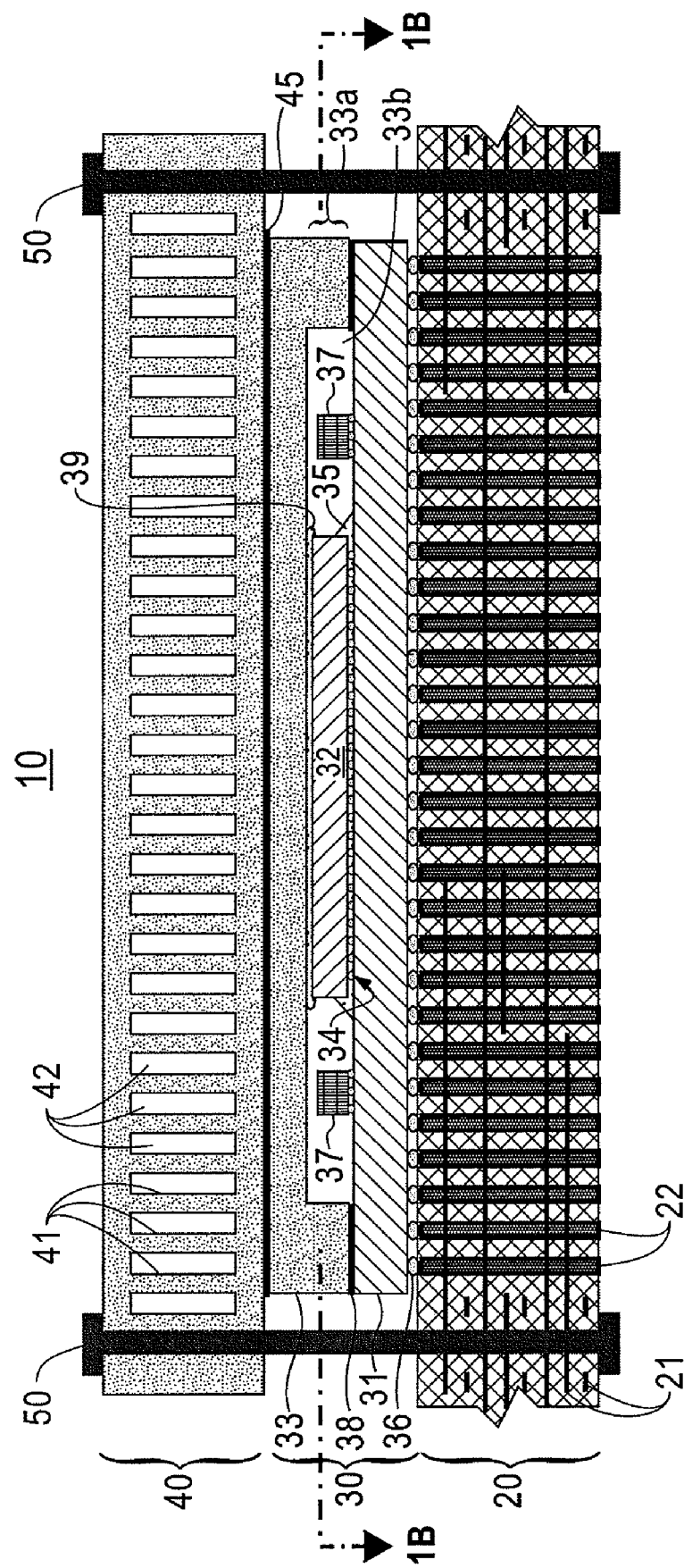
FIGS. 1A and 1B schematically illustrate an embodiment of an electronic module having a conventional framework for packaging a single chip module (SCM) with a liquid cooling device.
Figure 1B:
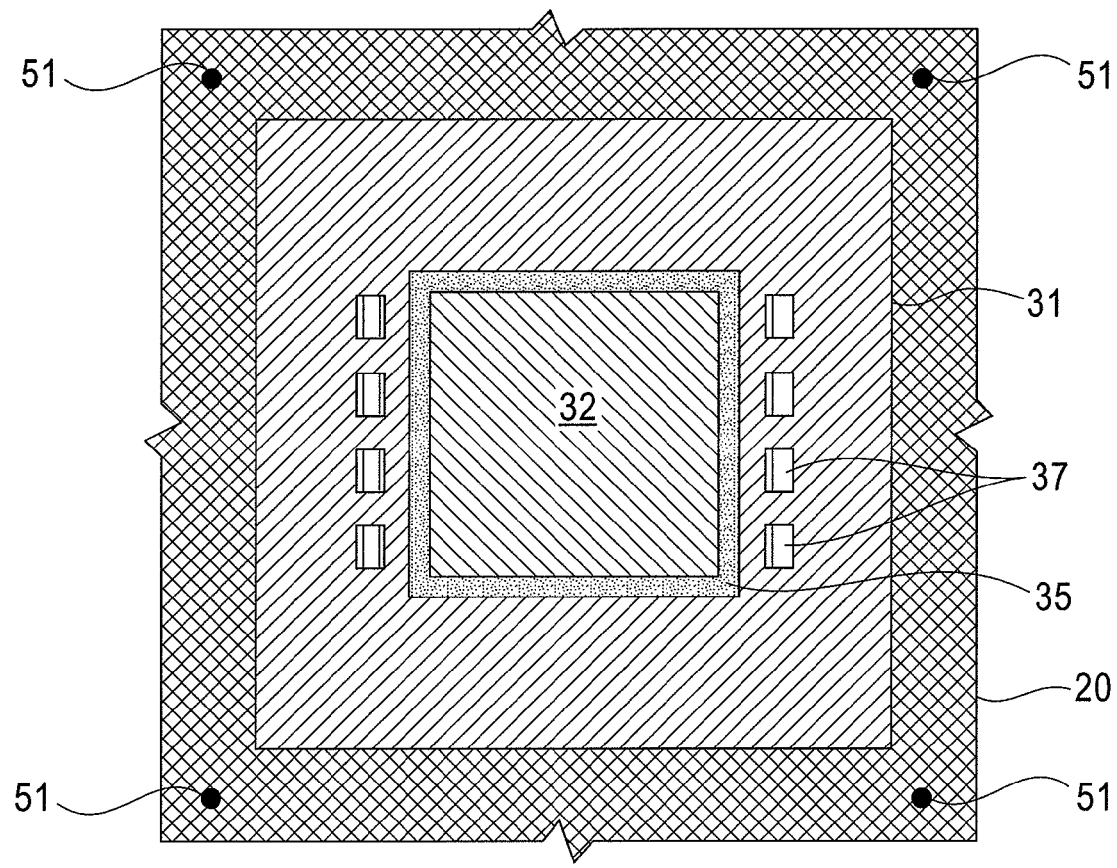
Figure 2A:
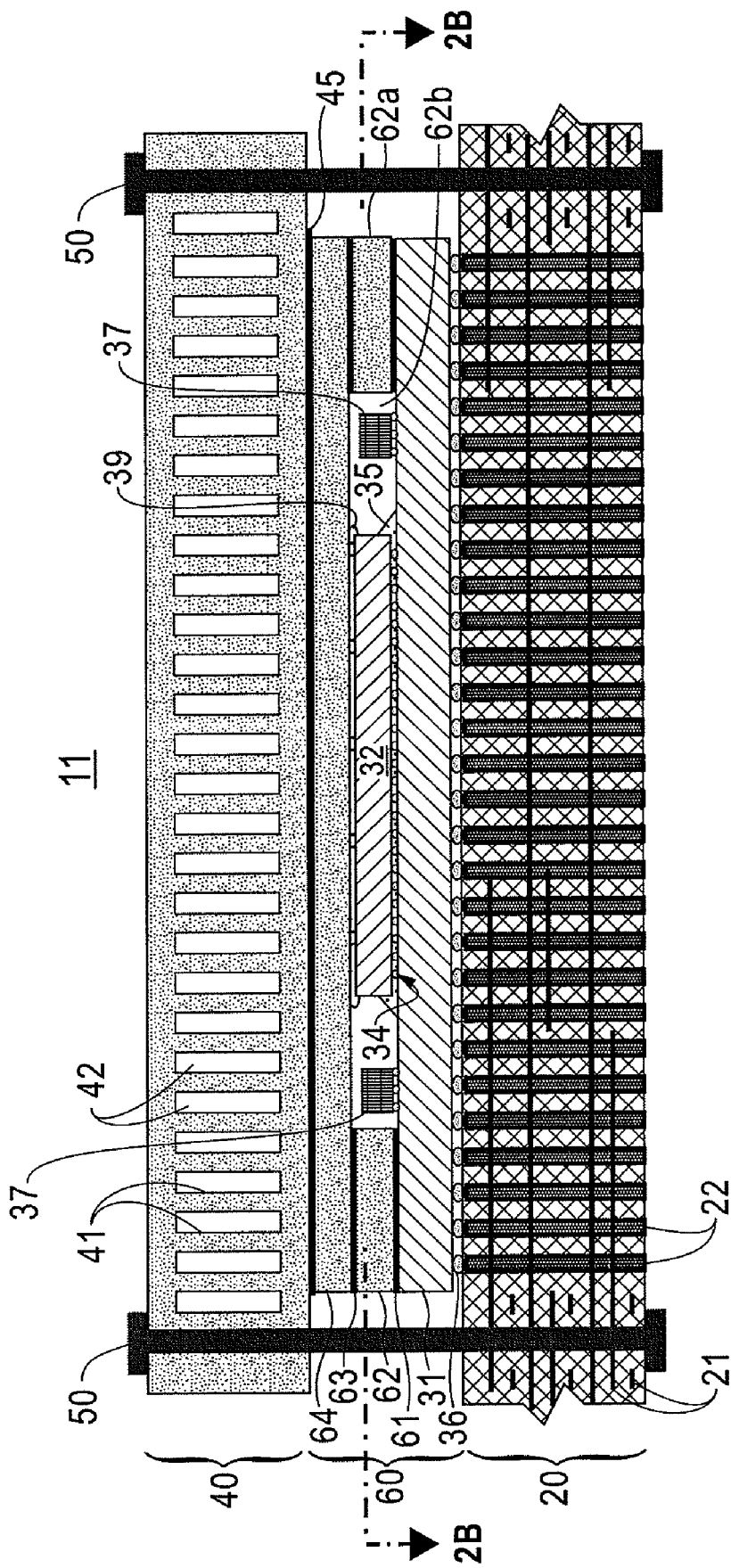
FIGS. 2A and 2B schematically illustrate another embodiment of an electronic module having a conventional framework for packaging a single chip module (SCM) with a cooling device.
Figure 2B:
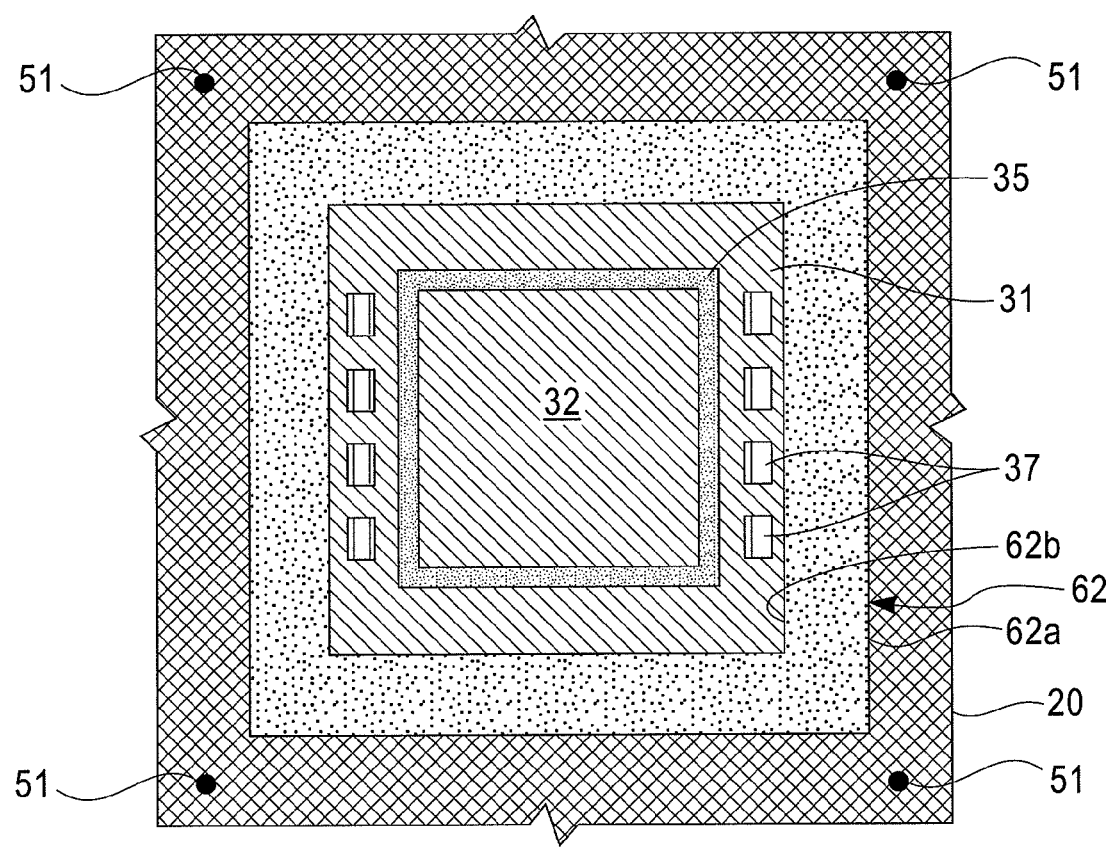
Figure 3:
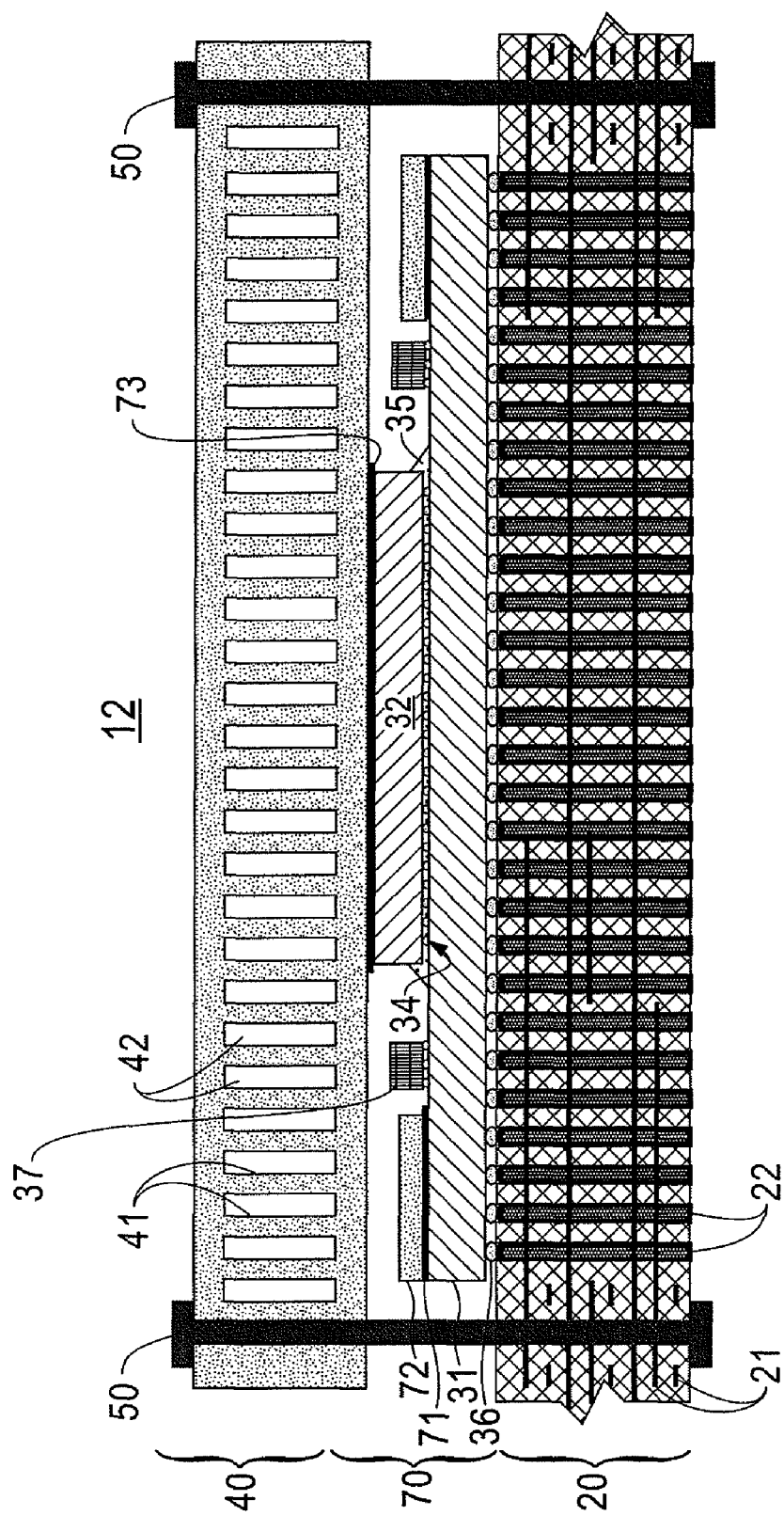
FIG. 3 schematically illustrates another embodiment of an electronic module having a conventional framework for packaging a single chip module (SCM) with a cooling device.

The exemplary package structures (100), (101) and (102) provide the high thermal performance advantages of a lidless package (such as in FIG. 3) i.e. only a single TIM layer (127) is provided in the thermal path between the chip (122) and the cooler (123). Although no lid is used, the chip is still protected by the copper cooler (123). Further, a lower, and more repeatable, thermal resistance is achieved with the TIM1 layer (127) when adhesive TIM materials are used, the assembly process can be better controlled, and bond line between the chip and cooler can be reduced when the cooler is integrated into the first level package. Moreover, no attachment holes are required in the mother board (110). Further, the exemplary package structures (100), (101) and (102) allow for uniformity of load distribution when LGA type connectors are used to connect the module (120) to the board (110). With an LGA connector, it is necessary to provide a uniform load to actuate the LGA across the bottom surface of the package. The stiffener extensions (130, 130', 130") serve to couple the lid and stiffener together, which makes it easier to provide such a uniform actuation force. This is difficult to achieve with a lidless package such as is shown in FIG. 3, as noted above.

Another advantage of the exemplary embodiments is that a smaller metallic cooler can be used so the weight of the overall assembly is minimized and the cooler size need not be any larger than is required to effectively cool the chip. As noted above, the low weight is important for BGA assembly, along with shock and vibration resistance and it is desirable to minimize the cooler size as the fabrication cost of coolers often scale with their size and is significantly greater than that of stiffener, or lids. It is to be further appreciated that the metallic stiffener with extensions and cooler (123) function together to provide mechanical rigidity to the flexible organic laminate chip carrier (121).

A number of assembly processes are possible, where it is contemplated that in all cases that the cooler would be attached to the $1^{st}$ level package assembly before it is attached to a mother board or node card. Such a sequence is highly desirable as it allows an adhesive TIM (127) to be cured without subjecting the mother board (110) to the additional processing step and also due to logistical and yield issues. For the structures illustrated in FIGS. 4 and 5, the cooler (123) could be attached after the chip (122) and stiffener (130) are attached to the carrier (121). For the structure in FIG. 6, the cooler (123) and stiffener (130") would need to be attached to the carrier and chip after the chip was attached to the carrier.

Figure 7:
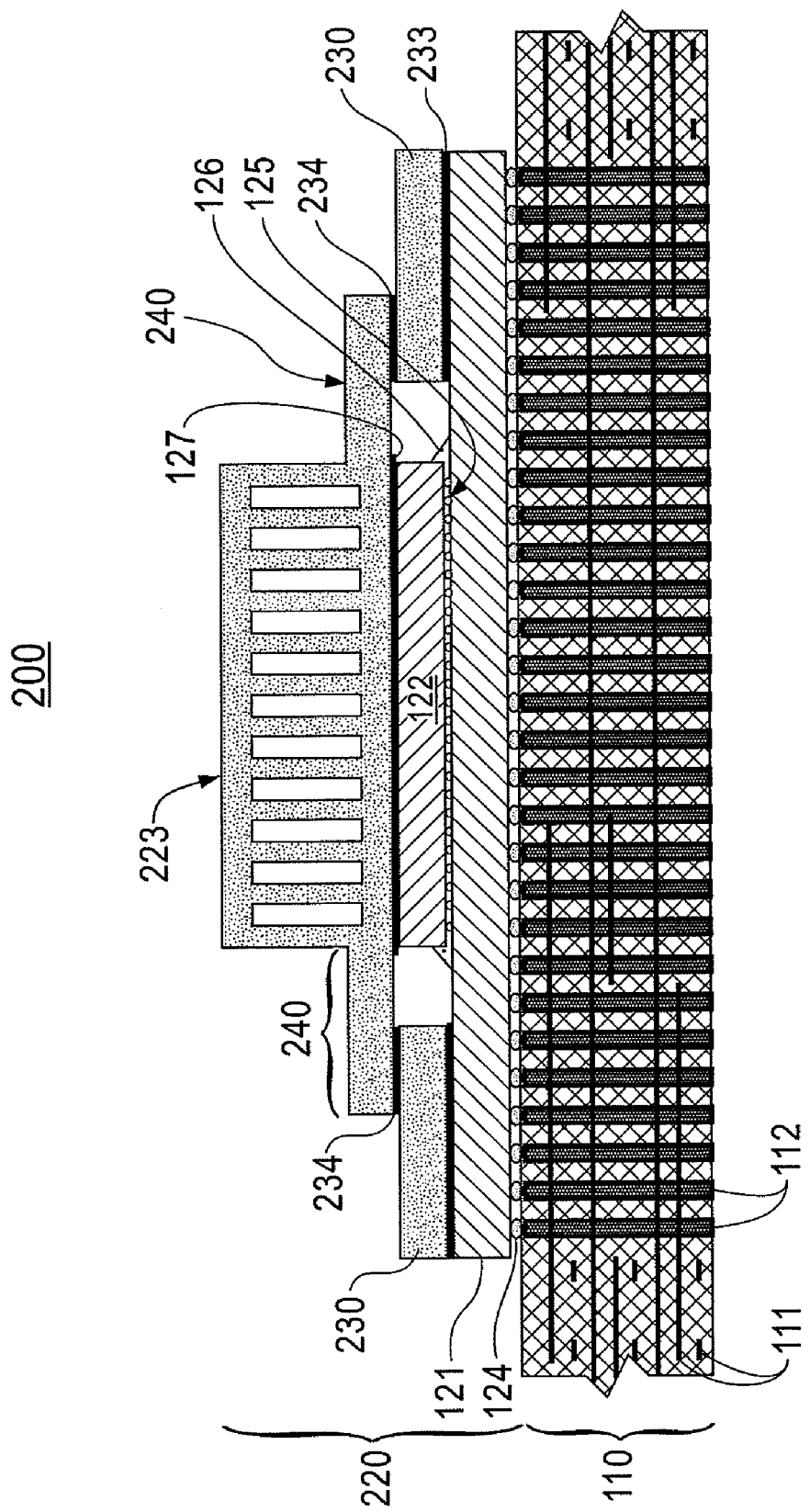
FIG. 7 schematically illustrates an electronic module having a chip level package structure with an integrated cooler, according to another exemplary embodiment of the invention.
Figure 8:
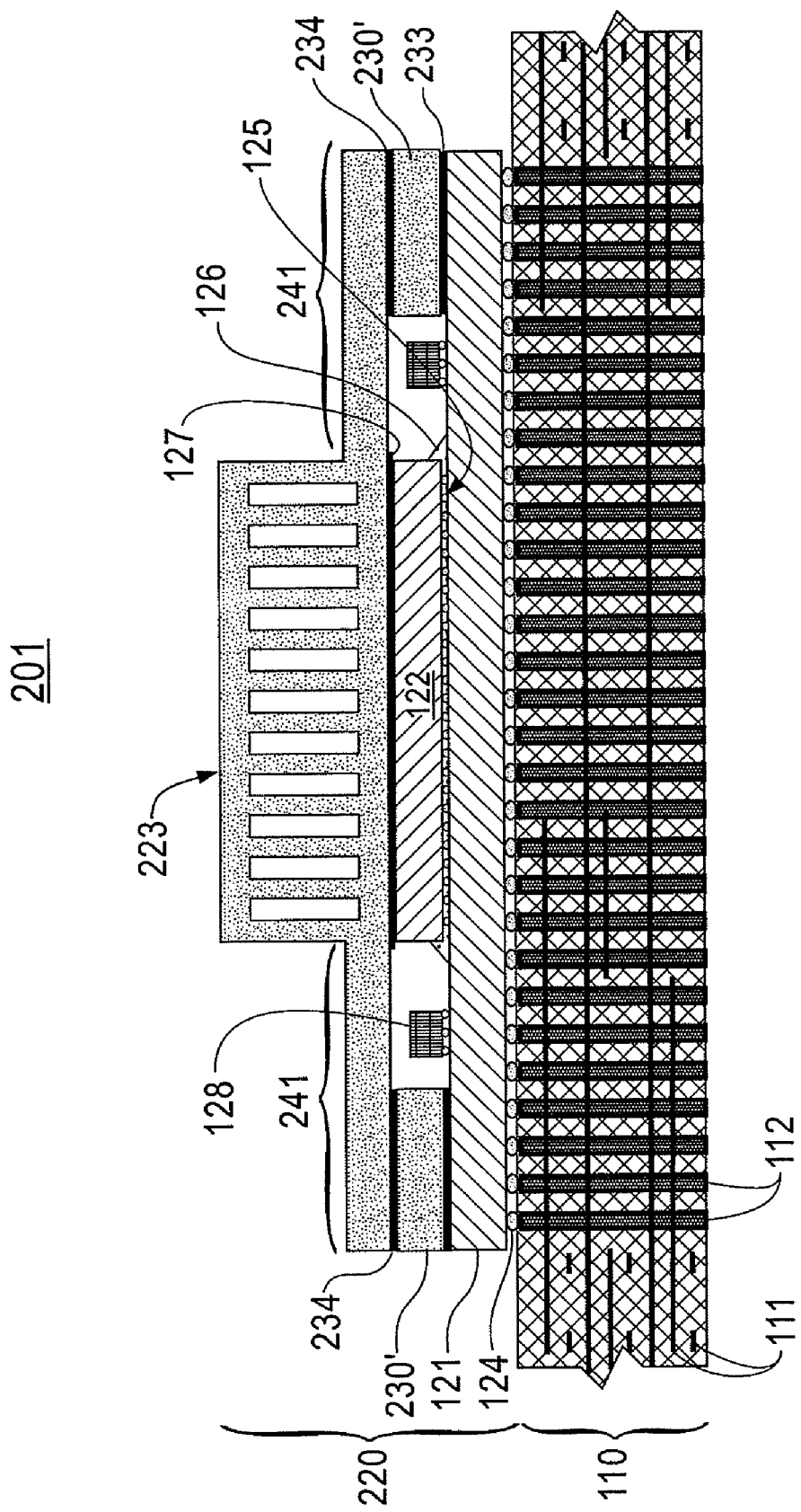
FIG. 8 schematically illustrates an electronic module having a chip level package structure with an integrated cooler, according to another exemplary embodiment of the invention.
Figure 9:
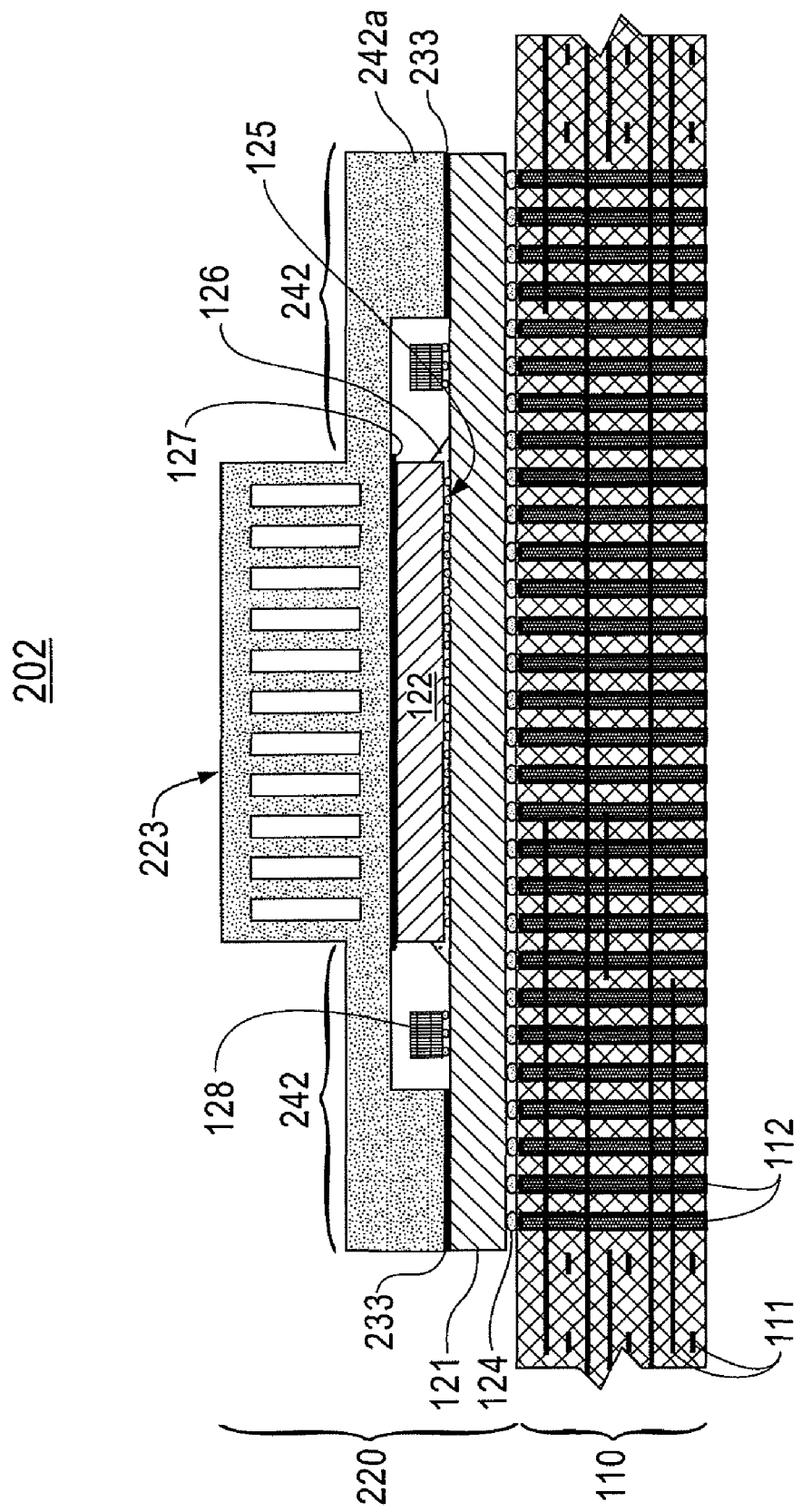
FIG. 9 schematically illustrates an electronic module having a chip level package structure with an integrated cooler, according to another exemplary embodiment of the invention.

In other exemplary embodiments of the invention, the metallic cooler device can be mechanically coupled to the substrate carrier using extension members that are integrally formed as part of the cooler module, which are bonded to a separate stiffener member on the substrate or directly to the substrate. For example, FIGS. 7, 8 and 9 are schematic cross section views of electronic modules having metallic coolers with integrally formed extension elements that are used to mechanically couple the cooler to the package. FIG. 7 schematically illustrates an electronic module having a chip level package with an integrated cooler module according to an exemplary embodiment of the invention. In particular, FIG. 7 is a schematic view of an electronic module (200) comprising a circuit board (110) (or node card, printed wiring board, or printed circuit card, etc,) and a chip package structure (220) mounted on the circuit board (110). The module (200) is similar in structure to previously discussed embodiments, except that the chip package structure (220) includes a metallic liquid cooling module (223) (or cooling apparatus or device) having integrally formed extensions (240) which are coupled to a stiffener member (230). The stiffener member (230) is a planar frame structure that is bonded to a peripheral surface region of the substrate (121) using a layer of adhesive material (233). The cooler extensions (240) extend from the bottom sidewall surfaces of the cooler (223) and are bonded to the stiffener member (230) using a layer of adhesive material (234). In the exemplary embodiment of FIG. 7, the stiffener (230) can be sized and shaped to provide sufficient bonding and rigidity to the substrate (121) and the cooler extensions (240) can be sized and shaped to provide adequate overlap of the stiffener member (230) to adhesively bond the cooler extensions sufficiently to the stiffener member (230).

FIG. 8 illustrates an electronic module (201) according to another exemplary embodiment of the invention which is similar to the module (200) of FIG. 7, except that the stiffener member (230') is smaller and the cooler (223) includes longer extensions (241) that extend from the bottom sidewall surfaces of the cooler (223) to the edges of the stiffener (230') and carrier (121). In this exemplary embodiment, the smaller footprint of the stiffener (230') provides more surface area on the substrate (121) to mount components (128) next to the chip (122), while ensuring that the overlap between the cooler extensions (241) and the stiffener member (230') is sufficient to adequately bond the cooler and stiffener.

FIG. 9 illustrates an electronic module (202) according to another exemplary embodiment of the invention which is similar to the exemplary embodiment of FIGS. 7 and 8, except that the metallic cooler (223) includes extensions (242) that are directly bonded to the peripheral surface region of the substrate (121). In particular, in FIG. 9, the extensions (242) are not bonded to separately formed and mounted stiffener member (as in FIGS. 7 and 8), rather, the extensions (242) are designed to have protruding peripheral rim portion (242a) on a bottom surface thereof, which is directly bonded to the substrate (121) using a layer of adhesive material (233).

In the exemplary embodiments of FIGS. 7, 8 and 9, the cooler extensions can be designed as continuous solid members (e.g., solid plate) that extend from the bottom surface of the cooler (223) that thermally bonds to the backside of the chip (122). In other exemplary embodiments, the extensions can be formed with apertures (similar in concept to the apertures of the stiffener extension tabs of FIG. 4B) as desired to reduce the amount of stress that would be imparted to the organic carrier substrate (121) and the chip (122). The portions of the cooler extensions adjacent the cooler (223) could have a thickness in the range of 0.5 to 2 mm if it is continuous and solid between the cooler (223) and where the extensions overlap the stiffener or reach the edge of the carrier. The embodiment shown in FIGS. 7, 8 and 9 would allow the use of an LGA connector as the cooler extensions would couple a load from the cooler into the stiffener, or directly into the organic carrier (121) and would be light enough for BGA reflow.

Figure 10A:
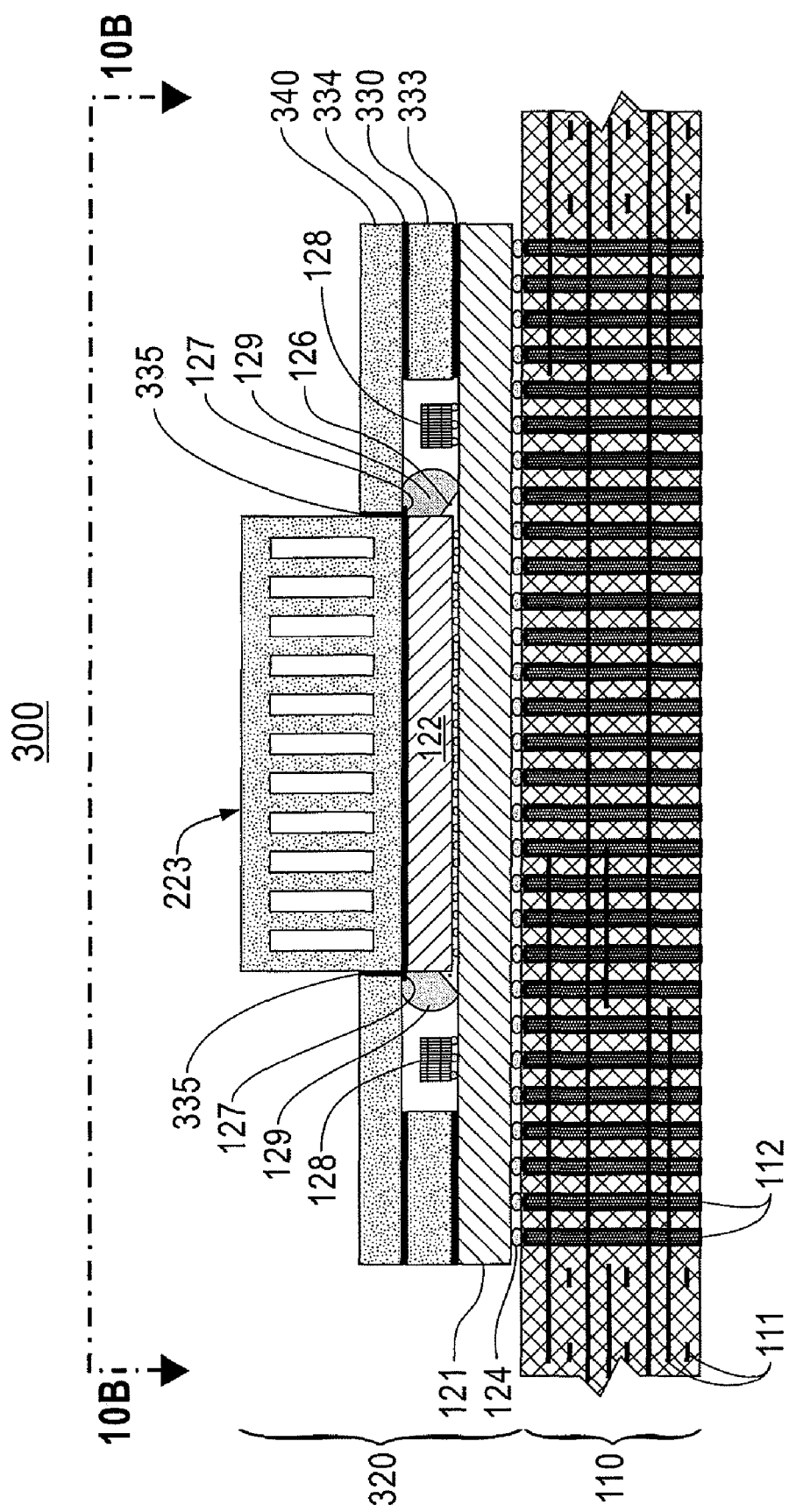
FIGS. 10A and 10B schematically illustrate an electronic module having a chip level package structure with an integrated cooler, according to another exemplary embodiment of the invention.
Figure 10B:
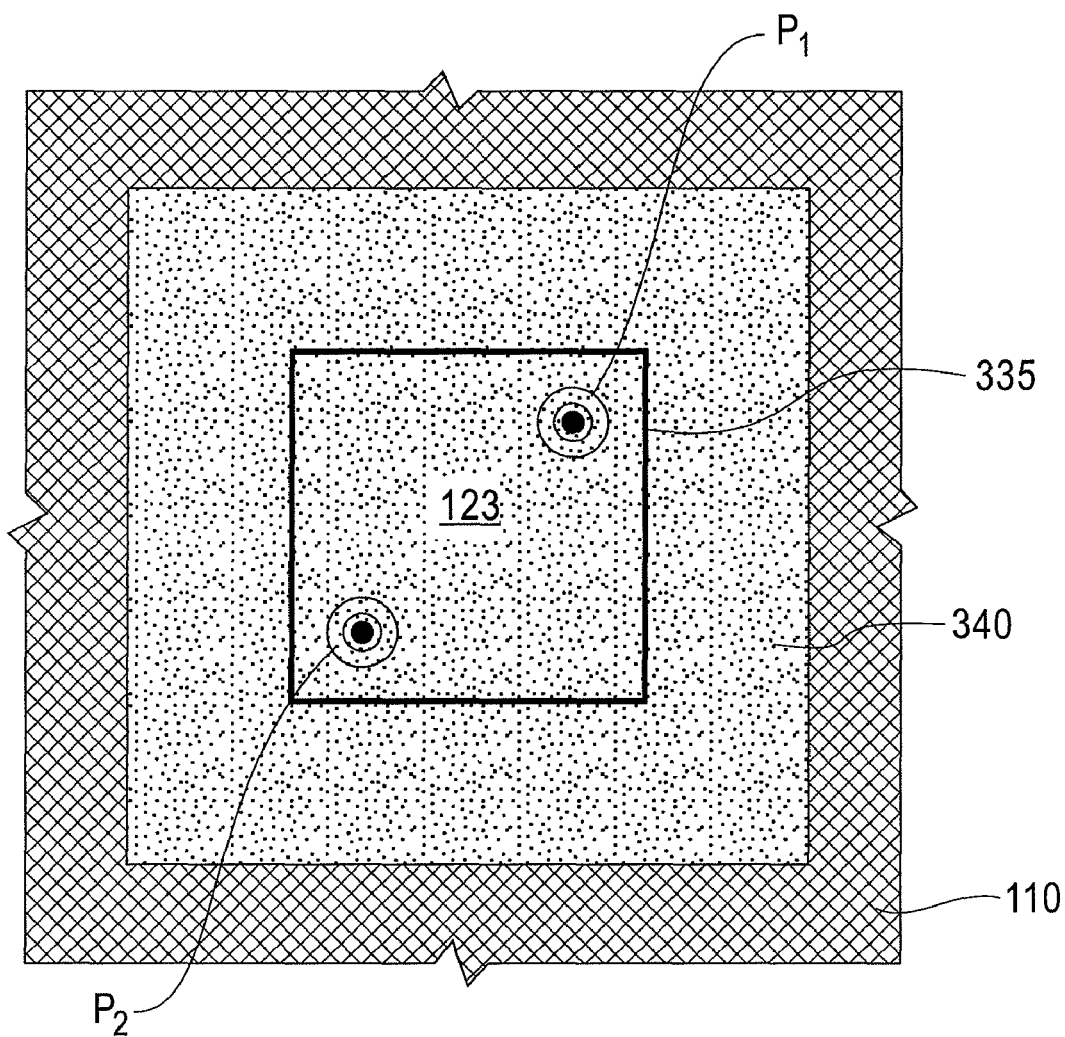

In other exemplary embodiments of the invention, a metallic cooler device can be mechanically coupled to a first level chip package substrate by bonding the sidewalls of a cooler to edges of an opening which is formed in a package lid, where the lid is either attached to a stiffener which is attached to the carrier, or where the lid is attached directly to the carrier, such as illustrated in the exemplary embodiments of FIGS. 10A/10B and 11. In particular, FIGS. 10A and 10B are schematic views of an electronic module (300) comprising a circuit board (110) (e.g., PCB, node card, printed wiring board, printed circuit card, etc,) and a chip package structure (320) mounted on the circuit board (110). FIG. 10A is a schematic side view of the electronic module (300) and FIG. 10B is a top plan view of the electronic module (300) along line 10B-10B in FIG. 10A. The electronic module (300) is similar in structure to previously discussed embodiments, except that the chip package structure (320) includes a planar package lid (340) having an aperture formed in a central region thereof, wherein the metallic liquid cooling module (123) is disposed in the aperture formed in the planar package lid (340). The edges of the metallic cooler are joined to an opening which is formed in a central region of the package lid (340) and where the lid (340) is adhesively attached to a stiffener member (330). The cooler device (123) is bonded to the inner edges of the lid aperture using a bond material (335), the package lid (340) is adhesively bonded to the stiffener member (330) via a layer of adhesive (334) and the stiffener (330) is bonded to the peripheral surface region of the substrate (121) with a layer of adhesive material (333). In FIG. 10A, an excess material of the TIM (127) between the chip (122) and the cooler (123) can be used to form a bridging bond (129) in the gap between the cooler/lid edge and the carrier surface (121) or underfill (126) adjacent to the sides of the chip (122). If an adhesive material is used for the TIM (127), the bridging bond (129) between the cooler/lid and the surface of the carrier in the region near the chip provides further means to prevent chip warpage. It is to be understood that the bridging bond (129) can be implemented in other exemplary embodiments described above.

FIG. 10B is a schematic top view of the package shown in FIG. 10A, including the fluid inlet and outlet ports (P1 and P2). The join between the cooler and the lid is also indicated. As with previous embodiments, the attachment between the cooler and the lid would couple them together and enable the use of an LGA connector.

Figure 11:
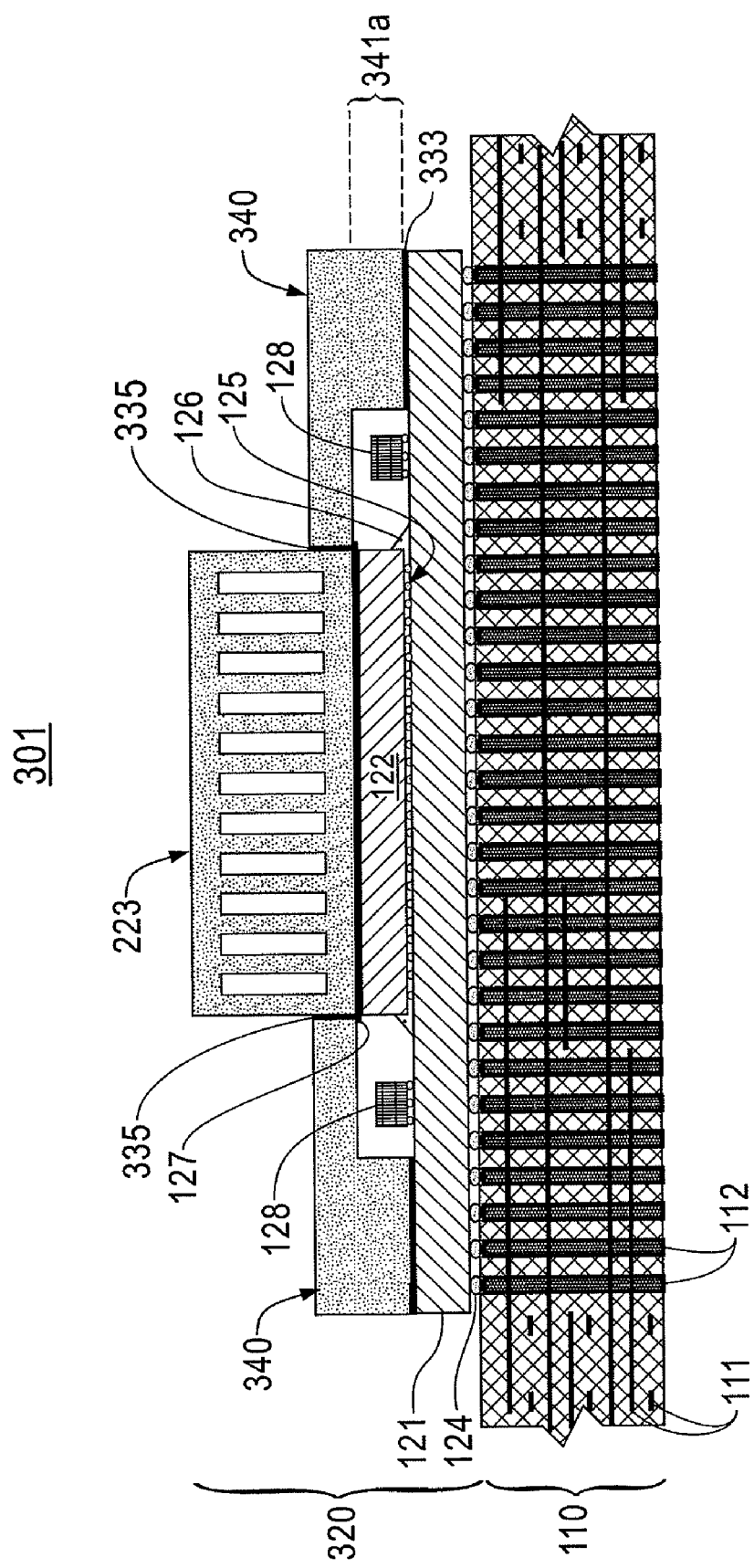
FIG. 11 schematically illustrates an electronic module having a chip level package structure with an integrated cooler, according to another exemplary embodiment of the invention.

FIG. 11 is a cross-sectional view of an electronic module (301) according to another exemplary embodiment of the invention, which is similar to the embodiment of FIG. 10A, except that the package lid (340) includes a peripheral rim portion (341a) that is formed on a peripheral bottom surface of the lid (340), which is directly bonded to the peripheral surface region of the substrate (121) using adhesion layer (333). Note that the lid serves to flatten and increase the stiffness of the laminate carrier when no stiffener is used. FIG. 11 differs from FIG. 10 in that the separate stiffener member (330) in FIG. 10 is eliminated.

In the exemplary embodiments of FIGS. 10 and 11, the package lid (340) can be formed of copper by stamping, coining or machining a bulk block of copper, wherein the lid aperture can be readily fabricated by these methods. The thickness of the lid may be 0.5 to 2.0 mm thick. The copper lids can be plated with nickel, or nickel and gold. The package lid (340) and the cooler (123) may be bonded using a layer of bond material (335), which can be solder, or a suitable adhesive material that could vary between a low modulus, flexible adhesive to a high strength structural adhesive to control the mechanical interaction of the cooling structure with various chip/substrate structures. The cooler size is minimized and the cooler (123) does not need to be any larger than is required to effectively cool the chip.

The exemplary package structures of FIGS. 10 and 11 can be assembled various ways. The cooler (123) and lid (340) could be assembled to the carrier (121) and chip (122) by either lid first, cooler first, or both at the same time after joining them together, or both at the same time and joined them together at the same time or later. In one preferred process, the cooler (123) and lid (340) may be joined as a subassembly, and then attached to the chip (122) and carrier (121) to minimize handling of individual parts during module assembly processing.

Figure 12A:
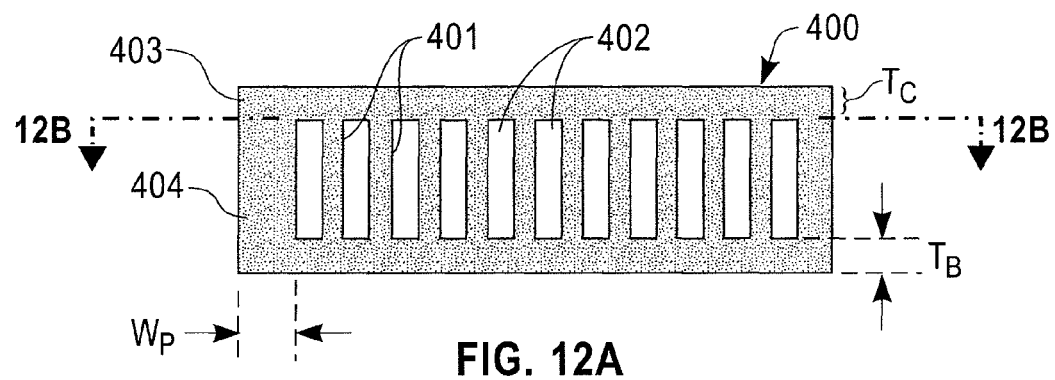
FIGS. 12A and 12B schematically illustrate an exemplary embodiment of a metallic cooler device that may be implemented in any of exemplary embodiments of the invention.
Figure 12B:
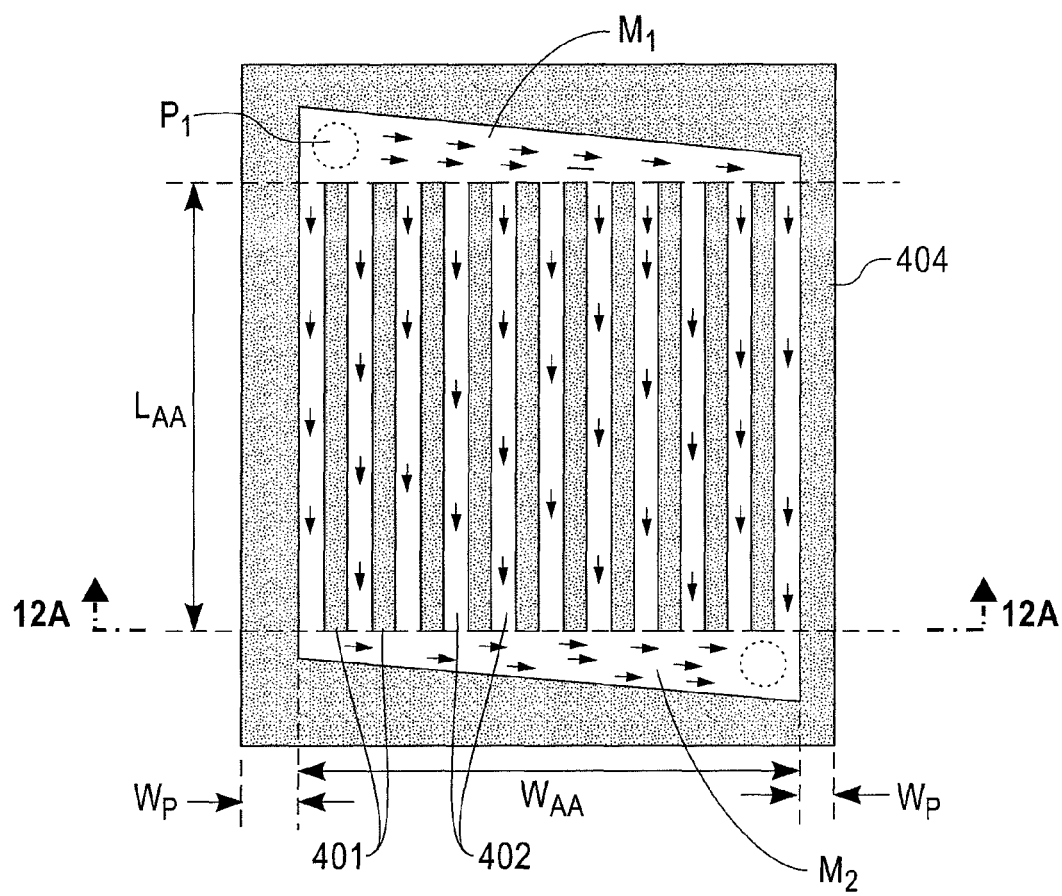

FIGS. 12A and 12B schematically illustrate a metallic liquid cooler device according to an exemplary embodiment of the invention. FIGS. 12A and 12B illustrate an exemplary framework of a metallic liquid cooler device (400) that may be implemented as the liquid cooler devices (123) and (223) shown in the exemplary package structures described above. FIG. 12A is a schematic cross sectional view of a metallic cooler device (400) taken along line 12A-12A in FIG. 12B and FIG. 12B is a schematic top plan view of the metallic cooler device (400) from the perspective of line 12B-12B in FIG. 12A.

In general, the liquid cooler device (400) includes a cooler body (404) comprising a plurality of thermal fins (401) and flow channels (402), and a cover plate (403). It is to be understood that other configurations of thermal fins and flow channels can be used such as mesh structures or staggered stacked microchannels as described in U.S. application Ser. No. 12/120,069, filed May 13, 2008, entitled Stacked and Redundant Chip Coolers, which is commonly assigned and incorporated herein by reference. The cover plate (403) is bonded to the top surface of the body (404) and the tops of the fins (401) thereby defining a chamber for the flow of a coolant (e.g., water) through the channels (402) between the inlet and outlet manifolds M1, M2. Heat removal is achieved by thermal contact between the fins (401) and the coolant fluid that flows through the channels (402). As shown in FIG. 12B, the thermal fins (401) include a plurality of elongated, parallel thermal fins that may be formed by etching/machining a block of metallic material (e.g., copper) to form the cooler body (404) flow channels (402) and tapered manifold channels (M1) and (M2). In the exemplary embodiment, the manifold channel M1 is a coolant supply manifold and the manifold channel M2 is a coolant return manifold, arranged on opposite ends of the flow channels (402). Further, the dotted circles P1 and P2 represent where respective input and output ports would be made in the cover plate (403) to provide the fluid supply/return connections.

The input manifold M1 and output manifold M2 are formed with tapered cross section channels to maintain the velocity of the fluid flow near constant and reduce dynamic pressure drop. For instance, the cross-sectional area of the flow channel of the supply manifold (M1) that is aligned with the inlet port (P1) is tapered to provide uniform distribution of coolant fluid to the input ends of the flow channels (402) fed by coolant fluid from the input manifold M1. Moreover, the cross-sectional area of the flow channel of the return manifold (M2) that is aligned with the output port (P2) is tapered to provide uniform redistribution of the output coolant fluid that flows out from the ends of each flow channel (402) into the output manifold M2. In such framework, the area of the flow channels of the manifolds are tapered sufficiently to reduce the dynamic pressure drop by maintaining the velocity of the coolant fluid substantially, or very close to, constant among the flow channels (402) in the metallic cooler device (400).

FIGS. 12A and 12B further illustrate that the outer perimeter walls of the cooler device (400) have a perimeter seal surface area (or seal band), of at least width Wp around the outside perimeter of the cooler. The perimeter seal width $W_P$ is typically in the range of 0.2 to 2.0 mm, to provide sufficient bonding area for bonding the cover plate (403) to the cooler body (404). An active cooling area of the cooler (400) is illustrated in FIG. 12B as a region with area of $L_{AA} \times W_{AA}$ which includes the alternating thermal fins (401) and flow channels (402) (or other microstructures which have a reduced hydraulic diameter and increased cooler surface area). The perimeter seal areas $W_P$ and manifold regions M1, M2 are not considered to be part of the active cooling area of the cooler (400). The cooler (400) has a base thickness ($T_B$), typically in the range of 0.3 to 2.4 mm, of solid material under the active cooling area $L_{AA} \times W_{AA}$, as indicated in FIG. 12A.

When constructing chip package structures with integrated metallic coolers according to exemplary embodiments of the invention as described herein, it is preferable to minimize the size of metallic cooler device while achieving sufficient cooling performance. For instance, with regard to cooler weight, if a BGA attachment to the board is used, it is desirable to minimize the total weight of the $1^{st}$ level package assembly. For a 50×50 mm carrier, increasing the Cu lid thickness from 2 mm to 3 mm was found to result in an increase in shorting between the BGA balls unless a modified join process with tighter process controls was used. Copper has a density of about 8.96 grams per cubic centimeter, so a 3 mm thick Cu lid corresponds to a weight of about 2.7 grams per square centimeter of carrier area. Therefore, an exemplary factor to consider when designing package structures is that the weight of the package lid, cooler, and stiffener should be less than the weight of a 3 mm thick Cu layer equal in dimensions to the carrier size, i.e. less than 2.7 grams per square cm of carrier area. The weight scales with the carrier size as proportionately more solder balls are used on a larger carrier.

Further, various factors may be considered when constructing metallic cooler devices that are thermally bonded directly to the backside of flip chip mounted chips on a flexible substrate so that the active region of the cooler is smaller than the area of the chip, but including the seal regions and manifold regions, the cooler is equal in size, or extends beyond the chip. With current 200 mm and 300 mm diameter silicon wafers, unless thinned, the resulting integrated circuit chips are about 0.7 to 0.8 mm thick. For a typical chip, the footprint of the active (powered) area extends to within about 0.1 mm to 0.2 mm from the physical edge of the chip. Given the thickness of the chip and the small distance from the active powered area to the chip edge, heat will spread over the entire chip area. In this regard, the entire chip may be considered to be powered and just the diced chip size considered, as long as the entire chip is in thermal contact with the cooler. As will be explained below, in one exemplary preferred embodiment of the invention, when a manifold region is not present between the active area and the perimeter seal band, the preferred configuration is for the cooler active area to be somewhat smaller than the chip size and for the perimeter seal to extend beyond the end of the chip.

Figure 13:
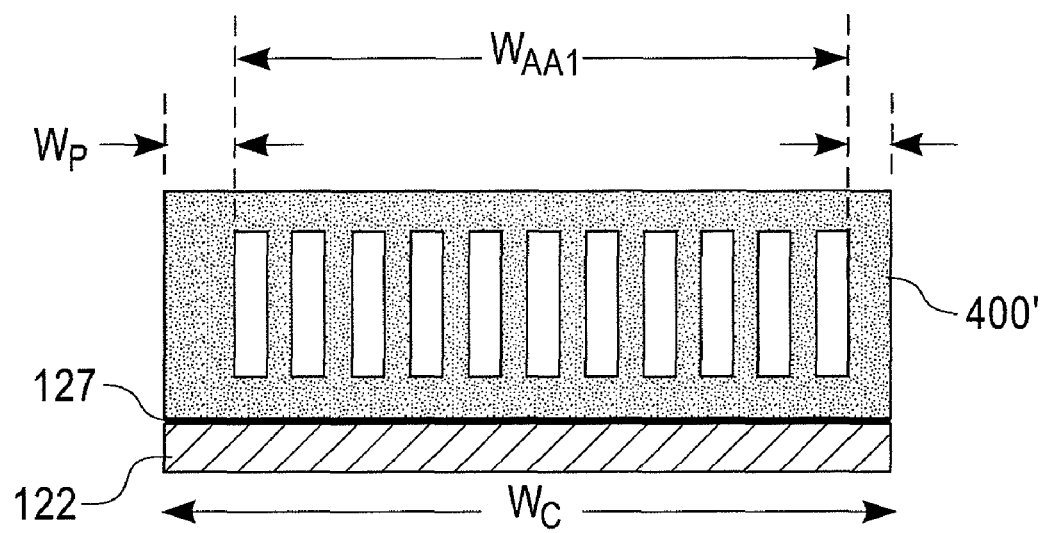
FIG. 13 schematically illustrates an exemplary cooler device that is thermally bonded to the backside of the chip using a TIM layer where the cooler is sized such that the cooler width is similar to the width of the chip and where the sides of the cooler do not extend past the sides of the chip, according to an exemplary embodiment of the invention.
Figure 14:
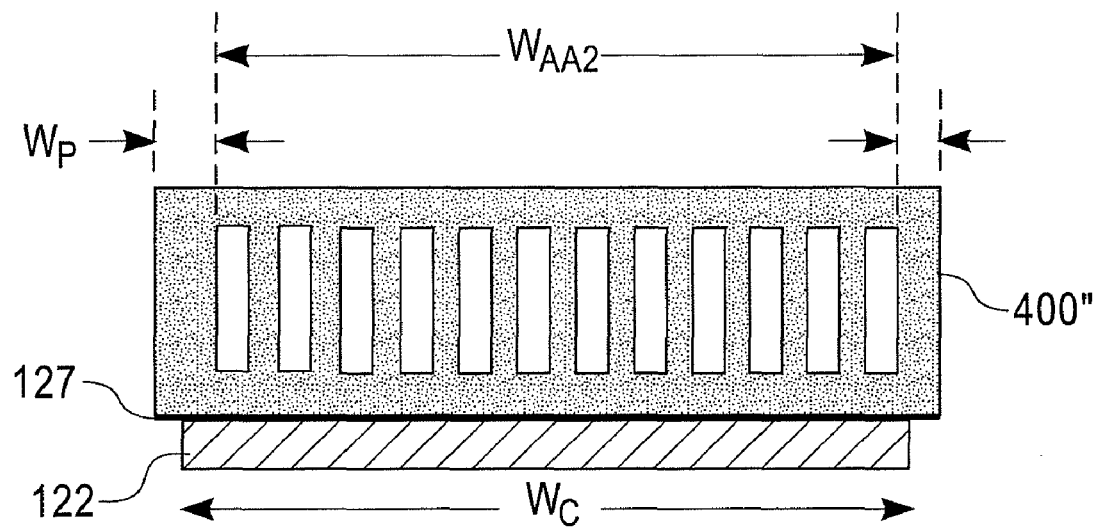
FIG. 14 schematically illustrates an exemplary cooler device that is thermally bonded to the backside of the chip using a TIM layer where the cooler is sized such that the cooler width is larger than the width of the chip at least in one dimension, according to an exemplary embodiment of the invention.

For instance, FIG. 13 illustrates an exemplary cooler device (400') that is thermally bonded to the backside of the chip (122) using thermal TIM layer (127) (as discussed above). In FIG. 13, the cooler (400') is sized such that the cooler width is similar to the width Wc of the chip (122) where the sides of the cooler (400) do not extend past the sides of the chip (122). FIG. 14 illustrates an exemplary cooler device (400") that is thermally bonded to the backside of the chip (122) using thermal TIM layer (127) (as discussed above), where the cooler (400") is sized such that the cooler width is greater than the width Wc of the chip (122) where the sides of the cooler (400") extend past the sides of the chip (122). The active area of the cooler (400') in FIG. 13 is smaller than the active area of the cooler (400") of FIG. 14 at least with regard to the difference in the widths $W_{AA}$ of the respective active areas. However, as will be shown below, the reduced active area (in FIG. 13) has little or no effect on the thermal performance. Given that the fabrication cost of a cooler is greater per unit area than that of a lid, stiffener extensions, etc. . . . , it is desirable to minimize the cooler size, and hence active area.

Thermal modeling was performed using commercially available software to determine optimum and minimum practical sizes for the "active cooler area" of a metallic cooler with a fixed coolant flow. In one process, a model of a package structure was defined with a silicon chip thermally bonded to a copper cooler device using a thin TIM layer. In the model, the silicon chip was defined to have a fixed size (area) of 22×22 mm, and a thickness of 0.785 mm. The TIM layer was defined to have a thermal conductivity of 3.8 W/m-K and a thickness of 2 mil. An effective heat transfer coefficient, determined assuming constant total liquid flow, was applied on the cooler active area along the cooler base and top, and the effects of the water temperature rise were considered. It was assumed that the fluid inlet was along a line dividing the chip in half, the outlets were parallel and at the edges of the active cooler area, and that the inlet and outlet regions did not displace any fins. The cooler base thickness, active area size, and perimeter seal width were varied. It was assumed that the cooler was fabricated from copper and that the sides of the cooler, i.e. the width of the perimeter seal, extended to a cooler top surface which had a thickness equal to the cooler base thickness and the cooler top was attached to the active cooling structure as was the cooler base. The total thermal resistance was calculated by dividing the difference between the maximum temperature on the active side of the chip and the inlet water temperature by the total power. A uniform power distribution across the chip, and a square cooler with a uniform seal width on all sides was assumed with no manifold regions. In the modeling, it was also assumed that the cooler base was flat and coplanar under both the active cooled region and the seal regions.

Figure 15A:
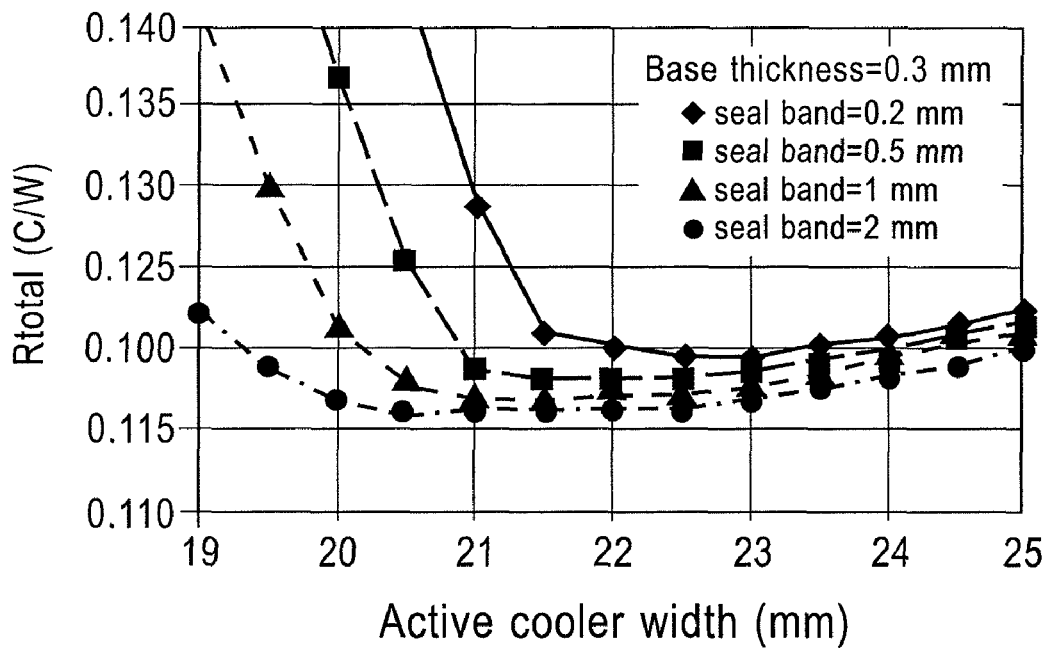
FIGS. 15A~15D are exemplary graphical diagrams that illustrate results of thermal modeling with respect to total thermal resistance (Rtotal) versus active cooler width WAA (in mm) for various seal band widths with different fixed base thickness values.
Figure 15B:
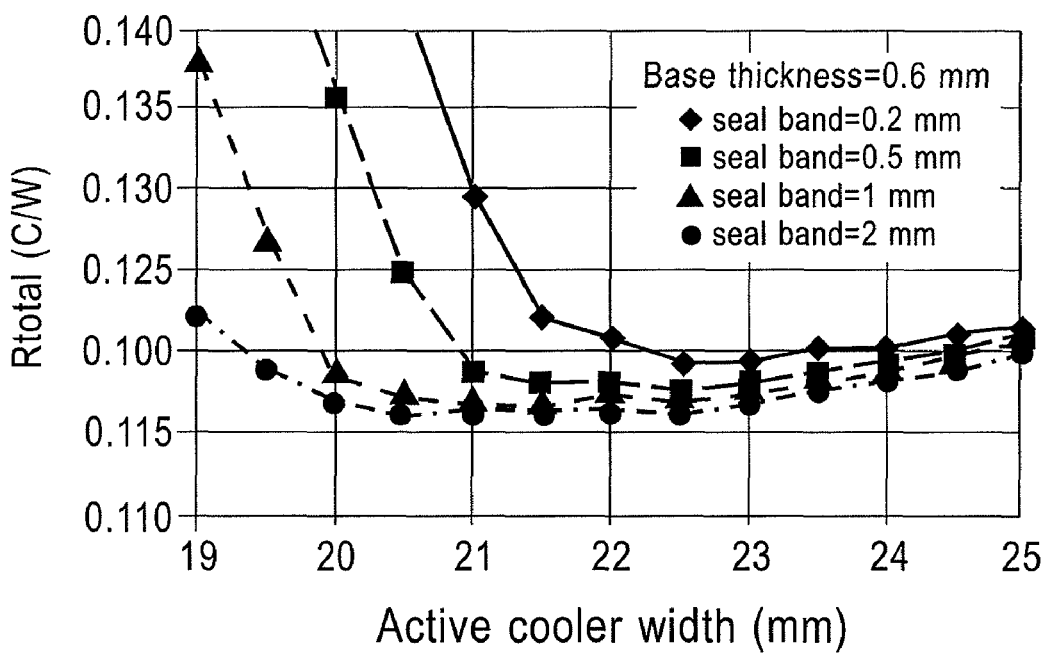
Figure 15C:
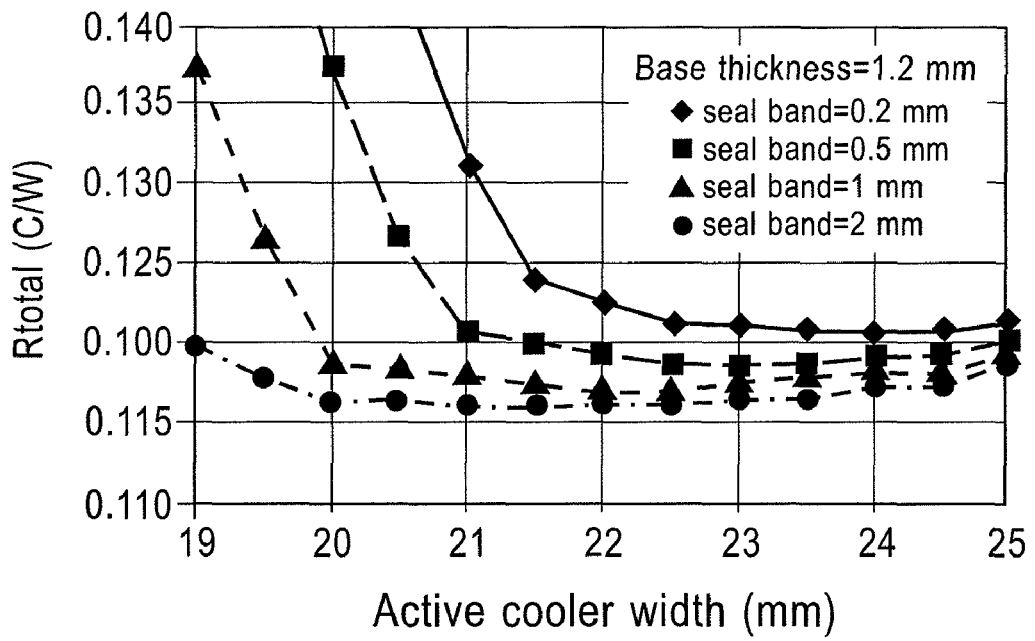
Figure 15D:
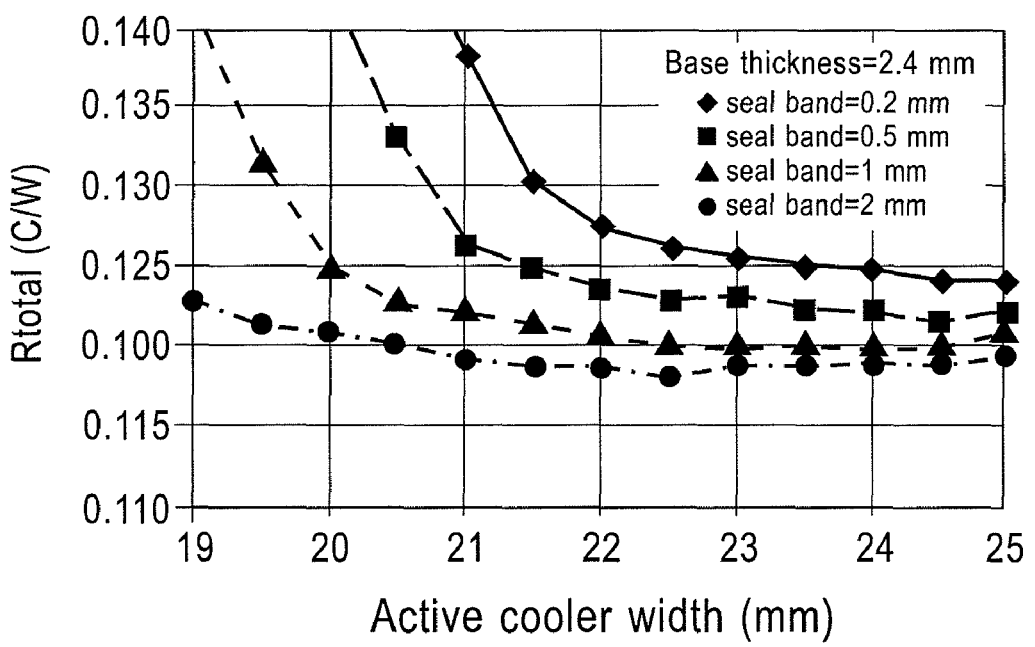

FIGS. 15A~15D are exemplary graphical diagrams that illustrate results of thermal modeling based on the above mentioned parameters. In particular, FIGS. 15A, 15B, 15C and 15D graphically illustrate a total thermal resistance (Rtotal) versus active cooler width $W_{AA}$ (in mm) for coolers with seal band widths Wp of 0.2, 0.5, 1.0 and 2.0 mm with fixed base thickness Tb values of 0.3 mm (FIG. 15A), 0.6 mm (FIG. 15B), 1.2 mm (FIG. 15C), and 2.4 mm (FIG. 15D). As shown in FIG. 15A, for a seal band width Wp of 2 mm, the total thermal resistance was nearly constant for active cooler widths $W_{AA}$ between 20 and 22.5 mm (i.e. within a few percent of the minimum value). Moreover, FIGS. 15B~15D illustrate that as the cooler base thickness Tb is increased, the minimum value for a fixed seal band width Wp increases slightly, due to the temperature drop in the thicker copper base. With a 2 mm seal band, in all cases, reducing the active area to 20 mm resulted in an increase in the thermal resistance by a maximum of 2% from the minimum value and in most cases by less.

For the case of a 1 mm seal band width Wp, the thermal resistance is shown to be nearly constant, or slightly increase, when the active area is reduced to 20.5 mm. When the active cooled area is less than 20 mm wide, the thermal resistance is shown to increase sharply as the seal band region does not extend to the edge of the chip. The total thermal resistance slowly increases for active areas greater than about 22 mm because the average fluid velocity inside the cooler active volume decreases hence reducing the local heat transfer coefficient between the fluid and the microstructure inside the cooler. The performance is found to be further reduced by increasing the amount of coolant bypassing the chip along the sides of the cooler and which is heated to a lesser degree than coolant which passes directly over the chip. Similar trends can be observed for the 0.5 mm and 0.2 mm seal band results. When no manifold region is present, or along the sides of the cooler without manifold regions, the active cooler size is preferably smaller than the chip size but the active cooler width plus the seal band widths is preferable equal to or somewhat greater than the chip size.

The above discussion suggests that a minimum base thickness is desirable, but the modeling results in FIGS. 15A~15D do not consider cooler devices having manifold regions at opposite ends of the active region before the perimeter seal region is reached (as in FIG. 12B) Depending on the cooler framework, such manifold regions may, or may not, be necessary. If manifold regions are present at the end of the active regions before the perimeter seal, then the width of the manifold region between the active region and the perimeter seal is preferably less than one to two times the base thickness of the cooler (e.g. if the base is 0.5 mm thick, the manifold region should be no more than 1 mm wide). Such a relationship allows heat spreading in the base to provide adequate cooling under the manifold region and would permit the active area of the cooler to be smaller than the chip area. An alternate solution would be to have the active area of the cooler be smaller than the cooler in the direction perpendicular to the coolant flow direction to reduce cooler size and cost, but be nearly equal, or equal to, the chip size in the direction parallel to the coolant flow.

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. An electronic apparatus, comprising:
    an organic laminate package substrate comprising first and second opposing surfaces, an IC (integrated circuit) chip flip-chip mounted to the first surface of the package substrate, and an area array of contacts pads formed on a second surface of the package substrate;
    a metallic stiffener structure bonded to the package substrate first surface to provide mechanical rigidity to the package substrate; and
    a metallic cooler device having upper and lower opposing surfaces and sidewall surfaces, wherein the lower surface of the metallic cooler device is thermally bonded directly to a backside surface of the IC chip;
    wherein the metallic cooler device is mechanically coupled to the metallic stiffener structure by extension tabs extending from the metallic stiffener member to each of the sidewall surfaces of the metallic cooler to fixedly maintain the metallic cooler device in position on the backside of the IC chip,
    wherein the metallic cooler device comprises a pattern of thermal fins and flow channels surrounded by sidewalls of the metallic cooler device,
    wherein a footprint area of the lower surface of the metallic cooler device includes an active surface cooling region and a non-active surface cooling region,
    wherein the active surface cooling region is defined by a surface area aligned to the pattern of thermal fins and flow channels between the sidewalls or other microstructures which have a reduced hydraulic diameter and increased cooler surface area;

wherein the non-active surface cooling region surrounds the active surface cooling region, and has an area defined, in part, by a width of the sidewalls around the peripheral region of the lower surface, wherein the IC chip has a length Lc and width Wc that defines a footprint size of the backside surface of the IC chip;

wherein the active cooling surface region on the lower surface of the metallic cooler device is smaller in a direction perpendicular to the flow channels than the IC chip size, and a width of the footprint area of the lower surface of the metallic cooler device is equal to or wider than the IC chip in the direction perpendicular to the flow channels.

2. The apparatus of claim 1, further comprising:
a second level package substrate; and
an area array of electrical contacts electrically connecting the area array of contact pads on the second surface of the organic package substrate to a corresponding array of contact pads on a first surface of the second level package substrate.

3. The apparatus of claim 2, wherein the area array of electrical contacts are BGA (ball grid array) electrical contacts.

4. The apparatus of claim 3, wherein a total weight of the metallic cooler and the metallic stiffener structure is equal to or less than about $$\frac{2.7 \text{ grams}}{\text{cm}^2} \times \text{Substrate Area (cm}^2),$$

when the metallic cooler device and the metallic stiffener structure are formed of a metallic material having a density of about $$\frac{9 \text{ grams}}{\text{cm}^2}.$$

5. The apparatus of claim 2, wherein the area array of electrical contacts include land grid array (LGA) contacts of an LGA compressed between the first and second package substrates, wherein LGA actuation is achieved with a compressive force applied to the metallic cooler device and stiffener or lid.

6. The apparatus of claim 1, wherein the organic laminate package substrate has a thickness that is less than about 0.8 mm.

7. The apparatus of claim 1, wherein the metallic cooler device is thermally bonded directly to the backside surface of the IC chip using a thermal adhesive bond material or a soft solder.

8. The apparatus of claim 1, wherein the metallic stiffener structure comprises:
a planar frame portion that is adhesively bonded to an outer peripheral region of the first surface of the organic package substrate; and
the extension tabs that mechanically couple the planar frame portion and the metallic cooler device together.

9. The apparatus of claim 8, wherein the extension tabs are integrally formed as part of the planar frame structure and are bonded to the metallic cooler device using adhesive bonding material.

10. The apparatus of claim 9, wherein the extension tabs are sized and shaped to apply a compressive force to the metallic cooler device against the backside surface of the IC chip.

11. The apparatus of claim 1, wherein the metallic cooler device comprise a coolant fluid inlet and a coolant fluid outlet on the upper surface thereof.

* * * * *